US012772658B2

(12) United States Patent
Park et al.

(10) Patent No.: US 12,772,658 B2
(45) Date of Patent: Oct. 20, 2026

(54) METHOD OF MANUFACTURING DISPLAY DEVICE

(71) Applicant: Samsung Display Co., LTD., Yongin-si (KR)

(72) Inventors: Joonyong Park, Yongin-si (KR); Hyuneok Shin, Yongin-si (KR); Juhyun Lee, Yongin-si (KR); Sukyoung Yang, Yongin-si (KR); Dongmin Lee, Yongin-si (KR); Samtae Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 523 days.

(21) Appl. No.: 18/218,754

(22) Filed: Jul. 6, 2023

(65) Prior Publication Data

US 2024/0090258 A1 Mar. 14, 2024

(30) Foreign Application Priority Data

Sep. 14, 2022 (KR) ........................ 10-2022-0115526

(51) Int. Cl.
*H10K 59/12* (2023.01)
*H10K 59/80* (2023.01)

(52) U.S. Cl.
CPC ..... *H10K 59/1201* (2023.02); *H10K 59/8792* (2023.02)

(58) Field of Classification Search
CPC ........... H10K 59/8792; H10K 59/8791; H10K 50/865; G02F 1/133512; G09G 2330/10; H10H 29/142; H01L 21/76877; C23C 14/225
See application file for complete search history.

(56) References Cited

U.S. PATENT DOCUMENTS

2015/0027876 A1* 1/2015 Choi .................. H01J 37/3452 204/192.12
2016/0013259 A1* 1/2016 Yang .................... H10K 59/126 257/40
2021/0013455 A1* 1/2021 Bae .................... H10K 59/8792

FOREIGN PATENT DOCUMENTS

JP 2007094047 A 4/2007
JP 2012209095 A 10/2012

(Continued)

*Primary Examiner* — Alia Sabur

(74) *Attorney, Agent, or Firm* — CANTOR COLBURN LLP

(57) ABSTRACT

A method of manufacturing a display device includes forming a barrier layer on a light emitting element, forming a first organic layer defining an opening exposing a portion of the barrier layer and overlapping the light emitting element on the barrier layer, forming a first preliminary low-reflection layer covering a first side surface of the first organic layer defining the opening and an upper surface of the first organic layer, forming a second preliminary low-reflection layer covering a second side surface of the first organic layer defining the opening and opposite to the first side surface and the upper surface of the first organic layer, forming a low-reflection barrier covering the first and second side surfaces defining the opening by anisotropic dry etching of the first preliminary low-reflection layer and the second preliminary low-reflection layer, and forming a second organic layer filling the opening of the first organic layer.

19 Claims, 14 Drawing Sheets

P_LCFb:P_MO1b,P_Mb,P_MO2b

(56) References Cited

FOREIGN PATENT DOCUMENTS

| | | | |
|---|---|---|---|
| KR | 1020120047799 | A | 5/2012 |
| KR | 1020210092351 | A | 7/2021 |

* cited by examiner

P_LCFa:P_M01a,P_Ma,P_M02a

P_LCFb:P_M01b,P_Mb,P_M02b

LCF:LCFa,LCFb
LCFa:M01a,Ma,M02a
LCFb:M01b,Mb,M02b

OL:OLa,OLb
LCF:LCFa,LCFb
LCFa:M01a,Ma,M02a
LCFb:M01b,Mb,M02b

METHOD OF MANUFACTURING DISPLAY DEVICE

This application claims priority to Korean Patent Application No. 10-2022-0115526, filed on Sep. 14, 2022, and all the benefits accruing therefrom under 35 U.S.C. § 119, the content of which in its entirety is herein incorporated by reference.

BACKGROUND

1. Field

Embodiments provide generally to a method of manufacturing a display device.

2. Description of the Related Art

A display device is a device that displays an image and includes a display area for displaying an image. Recently, the demand for a display device in which a viewing angle of an image displayed in the display area is limited is increasing.

For example, the display device is frequently used in public places, and in this case, the viewing angle of the image displayed in the display area may be desired to be limited so that people around the user cannot recognize the image displayed in the display area.

For another example, the viewing angle of the image displayed in a display area of a vehicle display may be desired to be limited to prevent an image displayed in the display area of the vehicle display (for example, navigation, etc.) from being reflected by the window of the vehicle and limiting driver's view during night driving.

Accordingly, a method of manufacturing a display device capable of limiting a viewing angle of an image displayed in a display area is being researched.

SUMMARY

Embodiments provide a method of manufacturing a display device capable of limiting a viewing angle of an image displayed in a display area.

A method of manufacturing a display device according to embodiments of the invention includes forming a barrier layer on a light emitting element, forming a first organic layer defining an opening exposing a portion of the barrier layer and overlapping the light emitting element in a plan view on the barrier layer, forming a first preliminary low-reflection layer covering a first side surface of the first organic layer defining the opening and an upper surface of the first organic layer, forming a second preliminary low-reflection layer covering a second side surface of the first organic layer defining the opening and opposite to the first side surface and the upper surface of the first organic layer, forming a low-reflection barrier covering the first side surface and the second side surface defining the opening by anisotropic dry etching of the first preliminary low-reflection layer and the second preliminary low-reflection layer, and forming a second organic layer filling the opening of the first organic layer.

In an embodiment, the first preliminary low-reflection layer may expose the second side surface defining the opening, and the second preliminary low-reflection layer may expose the first preliminary low-reflection layer covering the first side surface defining the opening.

In an embodiment, the first preliminary low-reflection layer may cover the first side surface defining the opening and one portion of an upper surface of the barrier layer, and the second preliminary low-reflection layer may cover the second side of the opening and a remaining portion of the upper surface of the barrier layer.

In an embodiment, the second preliminary low-reflection layer may further cover at least a portion of the first preliminary low-reflection layer covering the one portion of the upper surface of the portion of the barrier layer.

In an embodiment, the upper surface of the portion of the barrier layer exposed by the opening may be completely covered by the first preliminary low-reflection layer and the second preliminary low-reflection layer.

In an embodiment, the first preliminary low-reflection layer covering the one portion of the upper surface of the portion of the barrier layer and the second preliminary low-reflection layer covering the remaining portion of the upper surface of the portion of the barrier layer may be removed by the anisotropic dry etching.

In an embodiment, a portion of the first preliminary low-reflection layer overlapping the upper surface of the first organic layer and a portion of the second preliminary low-reflection layer overlapping the upper surface of the first organic layer may be removed by the anisotropic dry etching.

In an embodiment, the opening defined by the first organic layer may be provided in plural, and each of the openings may extend in a first direction in a plan view, and the openings may be arranged along a second direction crossing the first direction in the plan view, and the light emitting element may overlap at least one selected from the openings in the plan view.

In an embodiment, a thickness of the low-reflection barrier in a direction perpendicular to the first side surface defining the opening in an area adjacent to a lower portion of the first side surface defining the opening may be more than about 95% and less than about 100% of a thickness of the low-reflection barrier in the direction perpendicular to the first side surface defining the opening in an area adjacent to an upper portion of the first side surface defining the opening, and a thickness of the low-reflection barrier in a direction perpendicular to the second side surface defining the opening in an area adjacent to a lower portion of the second side surface defining the opening may be more than about 95% and less than about 100% of a thickness of the low-reflection barrier in the direction perpendicular to the second side surface defining the opening in an area adjacent to an upper portion of the second side surface defining the opening.

In an embodiment, the forming the first preliminary low-reflection layer may include forming a first preliminary base metal oxide layer covering the first side surface defining the opening and the upper surface of the first organic layer, forming a first preliminary metal layer covering the first preliminary base metal oxide layer, and forming a first preliminary cover metal oxide layer covering the first preliminary metal layer.

In an embodiment, the forming the second preliminary low-reflection layer may include forming a second preliminary base metal oxide layer covering the second side surface defining the opening and the first preliminary low-reflection layer covering the upper surface of the first organic layer, forming a second preliminary metal layer covering the second preliminary base metal oxide layer, and forming a second preliminary cover metal oxide layer covering the second preliminary metal layer.

In an embodiment, each of the first preliminary base metal oxide layer, the second preliminary base metal oxide layer, the first preliminary cover metal oxide layer, and the second preliminary cover metal oxide layer may include copper oxide or molybdenum-tantalum oxide.

In an embodiment, each of the first preliminary metal layer and the second preliminary metal layer may include copper, titanium, or molybdenum.

In an embodiment, the first preliminary low-reflection layer may be formed by a sputtering apparatus including a cylindrical target and a magnet disposed in the cylindrical target.

In an embodiment, the cylindrical target may extend along an extending direction of the opening.

In an embodiment, the magnet disposed in the cylindrical target may be positioned in a direction between a direction perpendicular to an upper surface of the barrier layer from a rotational axis positioned in the cylindrical target and a direction from an upper edge of the second side surface defining the opening toward a lower edge of the first side surface defining the opening.

In an embodiment, the second preliminary low-reflection layer may be formed by a sputtering apparatus including a cylindrical target and a magnet disposed in the cylindrical target.

In an embodiment, the cylindrical target may extend along an extending direction of the opening.

In an embodiment, the magnet disposed in the cylindrical target may be positioned in a direction between a direction perpendicular to an upper surface of the barrier layer from a rotational axis positioned in the cylindrical target and a direction from an upper edge of the first side surface defining the opening toward a lower edge of the second side surface defining the opening.

A method of manufacturing a display device according to embodiments may include forming a first preliminary low-reflection layer covering a first side surface defining an opening, forming a second preliminary low-reflection layer covering a second side surface defining the opening and opposite to the first side surface, and forming a low-reflection barrier covering the first side surface and the second side surface defining the opening by anisotropic dry etching of the first preliminary low-reflection layer and the second preliminary low-reflection layer.

Accordingly, the low-reflection barrier may be uniformly formed to have a thickness in a range set to have a preset optimal reflectance (for example, a minimum reflectance value that a material included in the low-reflection barrier).

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
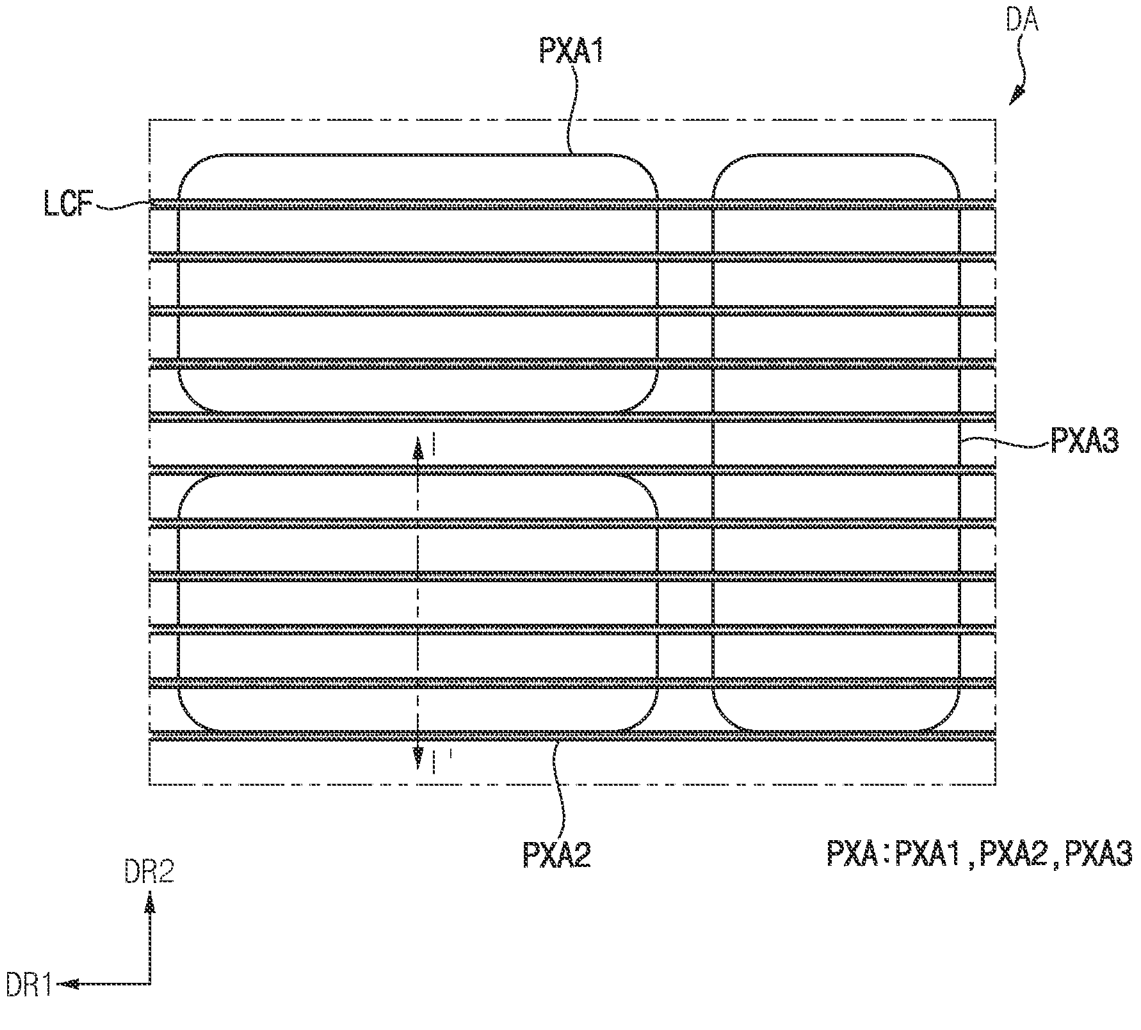
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings. The same reference numerals are used for the same components in the drawings, and any repetitive detailed descriptions of the same components will be omitted or simplified.

FIG. 1 is a plan view illustrating a display device according to an embodiment.

Referring to FIG. 1, a display device according to an embodiment may include a display area DA in which an image is displayed.

The display area DA may include a pixel area PXA, and the pixel area PXA may include a first pixel area PXA1, a second pixel area PXA2, and a third pixel area PXA3. Each of the first to third pixel areas PXA1, PXA2, and PXA3 may be an area that substantially emits light. In an embodiment, for example, the second pixel area PXA2 may be defined as an area in which light is emitted from the light emitting layer EL, which will be described later.

The first to third pixel areas PXA1, PXA2, and PXA3 may be disposed on a plane defined by a first direction DR1 and a second direction DR2 crossing the first direction DR1. In an embodiment, for example, as shown in FIG. 1, the first pixel area PXA1 may be disposed to space apart from the second pixel area PXA2 in the second direction DR2, and the third pixel area PXA3 may be spaced apart from the first and second pixel area PXA1 and PXA2 in a direction opposite to the first direction DR1. However, this is merely an example, and arrangement of the first to third pixel areas PXA1, PXA2, and PXA3 on the plane is not limited thereto.

In an embodiment, a low-reflection barrier LCF may be disposed to overlap the first to third pixel areas PXA1, PXA2, and PXA3 to limit a viewing angle of light emitted from each of the first to third pixel areas PXA1, PXA2, and PXA3. In an embodiment, the low-reflection barrier LCF may be provided in plural in the display area DA, and each of the low-reflection barriers LCF may extend in the first direction, and may be arranged along the second direction DR2. Accordingly, the plurality of low-reflection barriers LCF may block light emitted from the first to third pixel areas PXA1, PXA2, and PXA3 and traveling in the second direction DR2 or in a direction crossing the second direction DR2 to limit the viewing angle in the second direction DR2.

Figure 2:
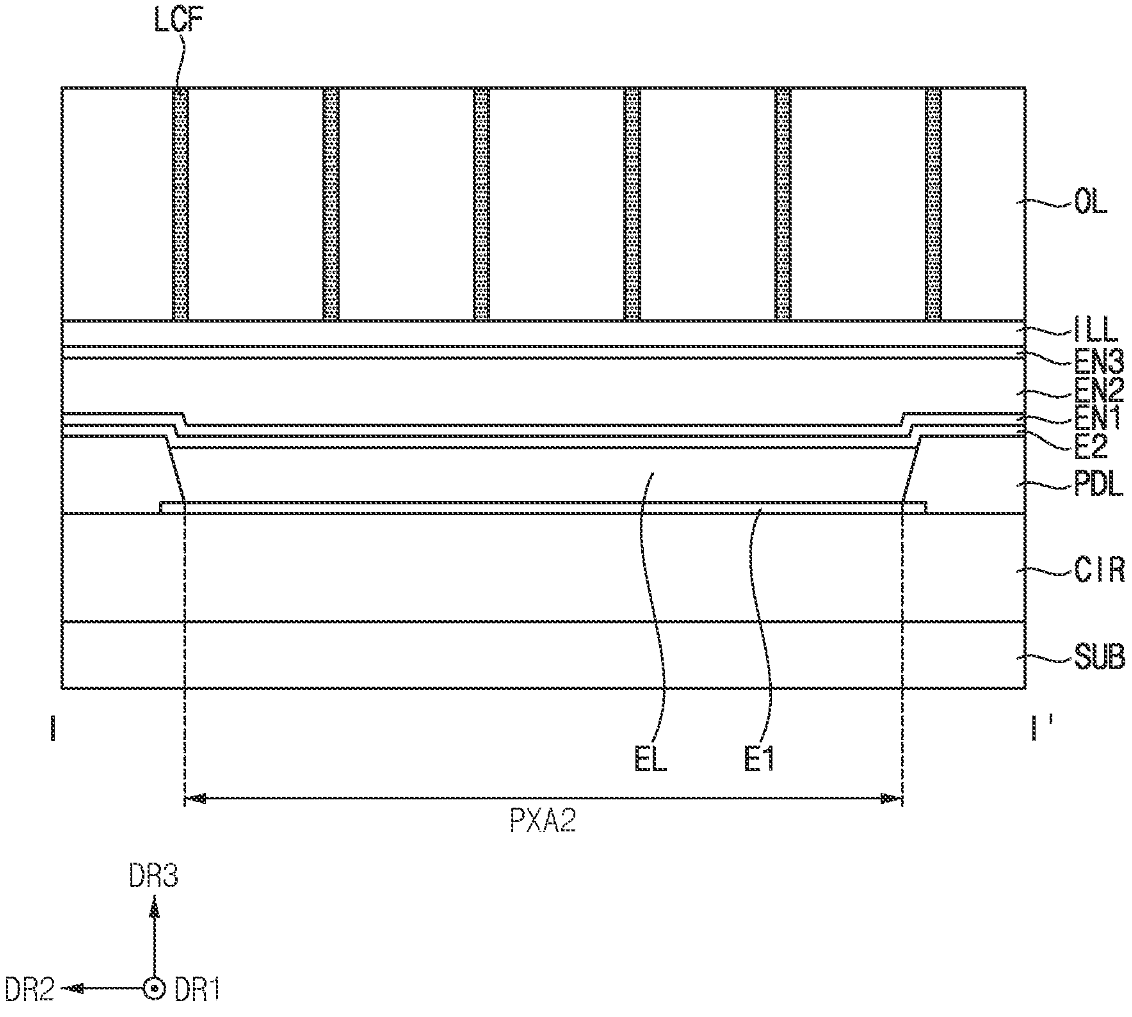
FIG. 2 is a cross-sectional view taken along line I-I' of FIG. 1.

FIG. 2 is a cross-sectional view taken along line I-I' of FIG. 1. In FIG. 2, only a cross-sectional view of the second pixel area PXA2 is illustrated for convenience of illustration and description. A cross-sectional view of each of the first and third pixel areas PXA1 and PXA3 may be substantially the same as (or similar to) the cross-sectional view of the second pixel area PXA2.

Referring to FIG. 2, the display device according to an embodiment may include a substrate SUB, a circuit layer CIR, a first electrode E1, a light emitting layer EL, a pixel defining layer PDL, a second electrode E2, a first encapsulation layer EN1, a second encapsulation layer EN2, a third encapsulation layer EN3, a barrier layer ILL, an organic layer OL, and a low-reflection barrier LCF.

The substrate SUB may include glass, plastic, etc. In an embodiment, the substrate SUB may have flexibility.

The circuit layer CIR may be disposed on the substrate SUB. The circuit layer CIR may include at least one transistor. In an embodiment, for example, the circuit layer CIR may include a driving transistor electrically connected to the first electrode E1 and providing a driving current to the first electrode E1.

The first electrode E1 may be disposed on the circuit layer CIR. The first electrode E1 may include a conductive material. In an embodiment, for example, the first electrode E1 may include silver, an alloy including silver, titanium, an alloy including titanium, molybdenum, an alloy including molybdenum, aluminum, an alloy including aluminum, aluminum nitride, tungsten, tungsten nitride, copper, indium tin oxide or indium zinc oxide, etc. These may be used alone or in combination with each other. In addition, the first electrode E1 may have a single-layer structure or multi-layer structure, each layer therein including at least one selected from the above materials. In an embodiment, the first electrode E1 may be referred to as an anode electrode.

The pixel defining layer PDL may be disposed on the circuit layer CIR, and may define a pixel opening exposing the first electrode E1. The pixel defining layer PDL may include an organic insulation material. In an embodiment, for example, the pixel defining layer PDL may include acrylic resin, methacrylic resin, polyisoprene, vinyl resin, epoxy resin, urethane resin, cellulose resin, siloxane resin, polyimide resin, polyamide resin or perylene resin, etc.

The light emitting layer EL may be disposed on the first electrode E1 in the pixel electrode. The light emitting layer EL may include a material emitting light. In an embodiment, for example, the light emitting layer EL may include an organic light emitting element. In an embodiment, the light emitting layer EL may further include an electron injection layer, an electron transport layer, a hole transport layer, a hole injection layer, etc.

The second electrode E2 may be disposed on the pixel defining layer PDL, and may cover the light emitting layer EL. The second electrode E2 may include a transparent conductive material. In an embodiment, for example, the second electrode E2 may include indium tin oxide or indium zinc oxide, etc. In an embodiment, the second electrode E2 may be referred to as a cathode electrode.

The first electrode E1, the light emitting layer EL disposed in the pixel opening, and the second electrode E2 may define a light emitting element. An area in which the light emitting element is defined may be the second pixel area PXA2 described with reference to FIG. 1. In an embodiment, as shown in FIG. 2, the second pixel area PXA2 may be an area corresponding to the pixel opening.

The first encapsulation layer EN1 may cover the second electrode E2. The first encapsulation layer EN1 may include an inorganic insulation material. In an embodiment, for example, the first encapsulation layer EN1 may include silicon nitride, silicon oxide or silicon oxynitride, etc.

The second encapsulation layer EN2 may cover the first encapsulation layer EN1. The second encapsulation layer EN2 may include an organic insulation material. Accordingly, an upper surface of the second encapsulation layer EN2 may be substantially flat.

The third encapsulation layer EN3 may cover the second encapsulation layer EN2. The third encapsulation layer EN3 may include an inorganic insulation material. In an embodiment, for example, the third encapsulation layer EN3 may include silicon nitride, silicon oxide or silicon oxynitride, etc.

The first to third encapsulation layer EN1, EN2, and EN3 may protect the first electrode E1, the light emitting layer EL, and the second electrode E2 from moisture and gas.

The barrier layer ILL may be disposed on the third encapsulation layer EN3. The barrier layer ILL may include an inorganic insulation material and/or an organic insulation material. In an alternative embodiment, the third encapsulation layer EN3 may be omitted, and in such an embodiment, the barrier layer ILL may serve as the third encapsulation layer EN3.

The organic layer OL may be disposed on the barrier layer ILL. The organic layer OL may define an opening extending in a third direction DR3 crossing the first and second directions DR1 and DR2 and exposing an upper surface of the barrier layer ILL. The organic layer OL may include an organic insulation material having a relative high light transmittance. In an embodiment, the organic layer OL may further include an inorganic insulation material. In an embodiment, for example, the organic layer OL may include a siloxane-based material and/or a silica-based material.

The low-reflection barrier LCF may be disposed in the opening defined in the organic layer OL. Accordingly, the low-reflection barrier LCF may extend in the third direction DR3. The low-reflection barrier LCF may include a material having a relatively low reflectivity. In an embodiment, for example, the low-reflection barrier LCF may have a tri-layer structure of metal oxide layer/metal layer/metal oxide layer. Accordingly, the low-reflection barrier LCF may absorb a portion of light emitted from the light emitting layer EL, and may limit a viewing angle of light emitted from the second pixel area PXA2. The low-reflection barrier LCF will be described later in greater detail with reference to FIG. 18 and FIG. 19.

FIG. 3 to FIG. 19 are cross-sectional views illustrating an embodiment of a method of manufacturing the display device of FIG. 1. In FIG. 3 to FIG. 19, for convenience of description, only components disposed on the barrier layer ILL are shown.

Figure 3:
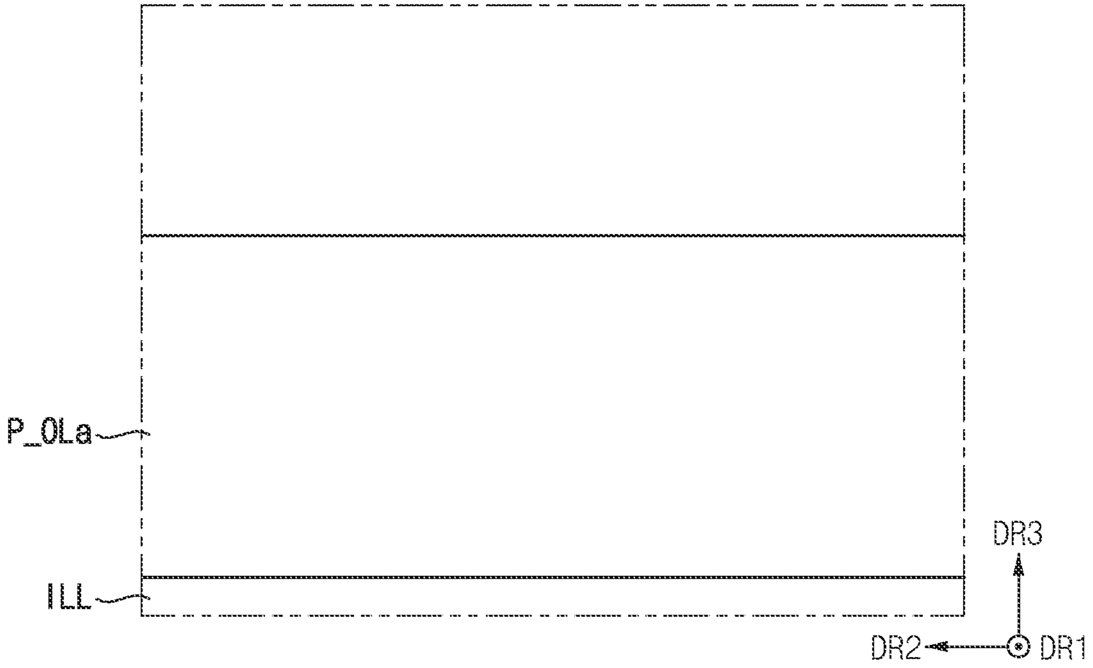
FIG. 3 to FIG. 19 are cross-sectional views illustrating an embodiment of a method of manufacturing the display device of FIG. 1.

Referring to FIG. 3, a first preliminary organic layer P_OLa may be formed on the barrier layer ILL. The first preliminary organic layer P_OLa may include an organic material having relatively high light transmittance. In an embodiment, for example, the first preliminary organic layer P_OLa may include a same material as the organic layer OL.

Figure 4:
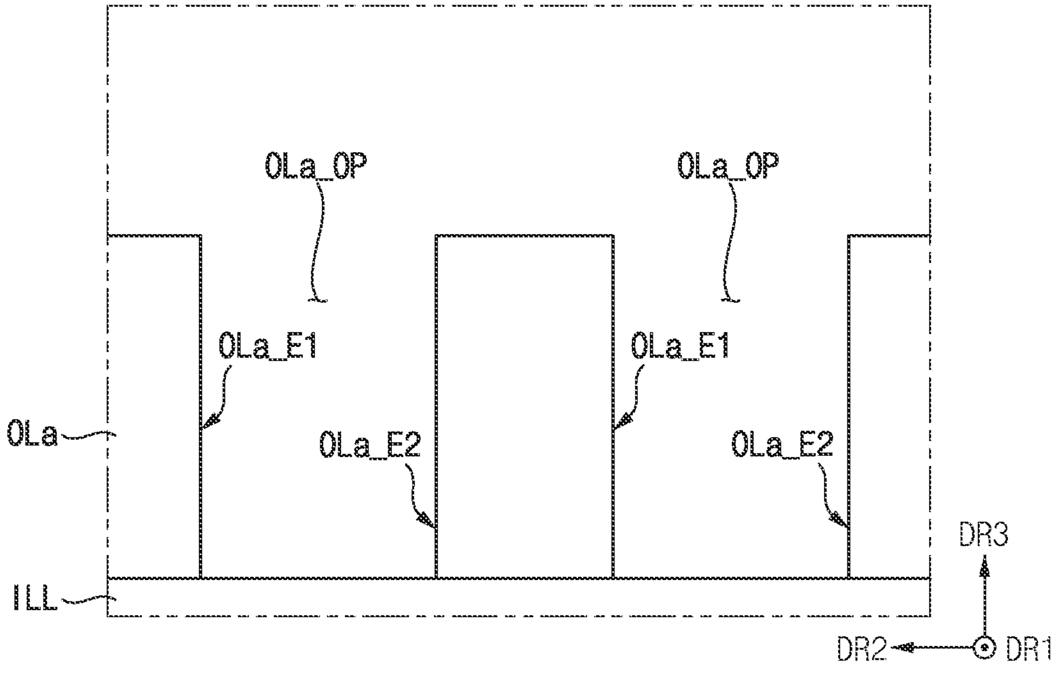

Referring to FIG. 4, a first organic layer OLa defining an opening OLa_OP exposing an upper surface of the barrier layer ILL may be formed by removing a portion of the first preliminary organic layer P_OLa. The opening OLa_OP may be defined by a first side surface OLa_E1 and a second side surface OLa_E2 opposite to the first side surface OLa_E1, and each of the first and the second side surfaces OLa_E1 and OLa_E2 may be a side surface of the first organic layer OLa.

The opening OLa_OP may be provided in plural. In a plan view, the openings OLa_OP may extend in the first direction DR1, and may be arranged along the second direction DR2. In addition, each of the first to third pixel areas PXA1, PXA2, and PXA3 may overlap at least one of the openings OLa_OP in a plan view.

Hereinafter, an embodiment of a method of forming a first preliminary low-reflection layer P_LCFa will be described with reference to FIG. 5 to FIG. 10.

Figure 5:
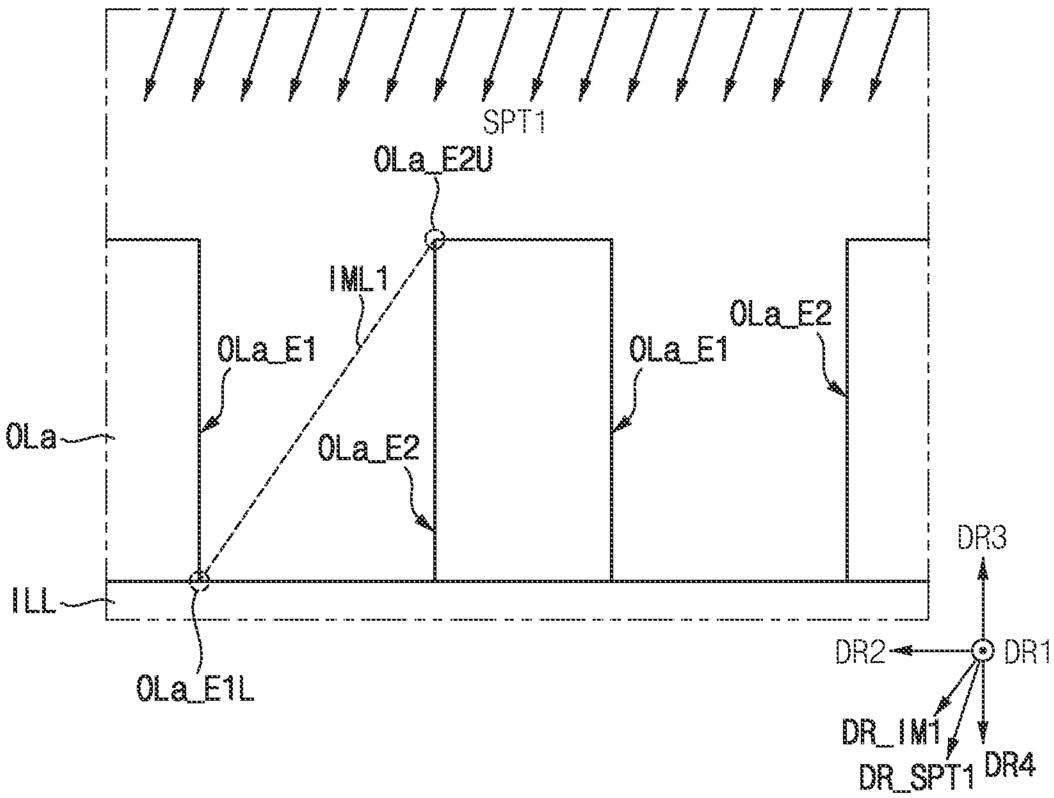
Figure 6:
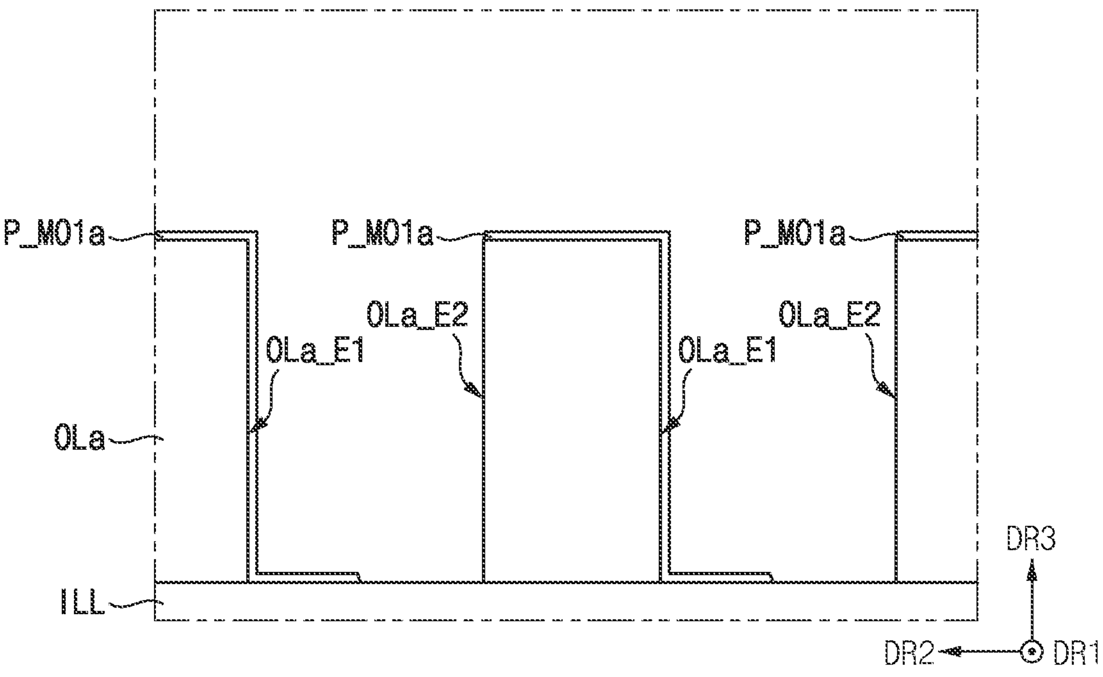

Referring to FIG. 5 and FIG. 6, a first preliminary base metal oxide layer P_MO1*a* may be formed by a first sputtering SPT1. The first preliminary base metal oxide layer P_MO1*a* may include a metal oxide. In an embodiment, for example, the first preliminary base metal oxide layer P_MO1*a* may include copper oxide or molybdenum-tantalum oxide.

In the first sputtering SPT1, particles emitted from a sputtering target may proceed in a first sputtering direction DR_SPT1. That is, the first sputtering SPT1 may be an oblique sputtering.

The first sputtering direction DR_SPT1 may be a direction between a fourth direction DR4 and an extending direction DR_IM1 of a first imaginary line IML1. The fourth direction DR4 may be a direction opposite to the third direction DR3, and the first imaginary line IML1 may be a line extending from an upper edge OLa_E2U of the second side surface OLa_E2 to a lower edge OLa_E1L of the first side surface OLA_E1. Accordingly, the first preliminary base metal oxide layer P_MO1*a* formed by the first sputtering SPT1 may substantially completely cover the first side surface OLA_E1 and may expose the second side surface OLa_E2. In an embodiment, the first preliminary base metal oxide layer P_MO1*a* may further cover an upper surface of the first organic layer OLa and a portion of the upper surface of the barrier layer ILL exposed by the opening OLa_OP.

In addition, since the first preliminary base metal oxide layer P_MO1*a* is formed by the oblique sputtering, the first preliminary base metal oxide layer P_MO1*a* may have a relatively uniform thickness. In an embodiment, for example, a thickness of the first preliminary base metal oxide layer P_MO1*a* in a direction perpendicular to the first side surface OLa_E1 in an area adjacent to an upper portion of the first side surface OLa_E1 (for example, A1 in FIG. 18) may be substantially the same as a thickness of the first preliminary base metal oxide layer P_MO1*a* in the direction perpendicular to the first side surface OLa_E1 in an area adjacent to a lower portion of the first side surface OLa_E1 (for example, A2 in FIG. 18).

In a case, where the first preliminary base metal oxide layer P_MO1*a* is not formed by the oblique sputtering, the particles emitted from the sputtering target may travel in arbitrary directions between the second direction DR2 and a direction opposite to the second direction DR2. In this case, some of the particles may be blocked by the first organic layer OLa, and accordingly, relatively small number of particles may be deposited in the area adjacent to the lower portion of the first side surface OLa_E1 compared to the area adjacent to the upper portion of the first side surface OLa_E1. That is, the thickness of the first preliminary base metal oxide layer P_MO1*a* in the direction perpendicular to the first side surface OLa_E1 in the area adjacent to the upper portion of the first side surface OLa_E1 (for example, A1 in FIG. 18) may be larger than the thickness of the first preliminary base metal oxide layer P_MO1*a* in the direction perpendicular to the first side surface OLa_E1 in the area adjacent to the lower portion of the first side surface OLa_E1 (for example, A2 in FIG. 18).

Figure 7:
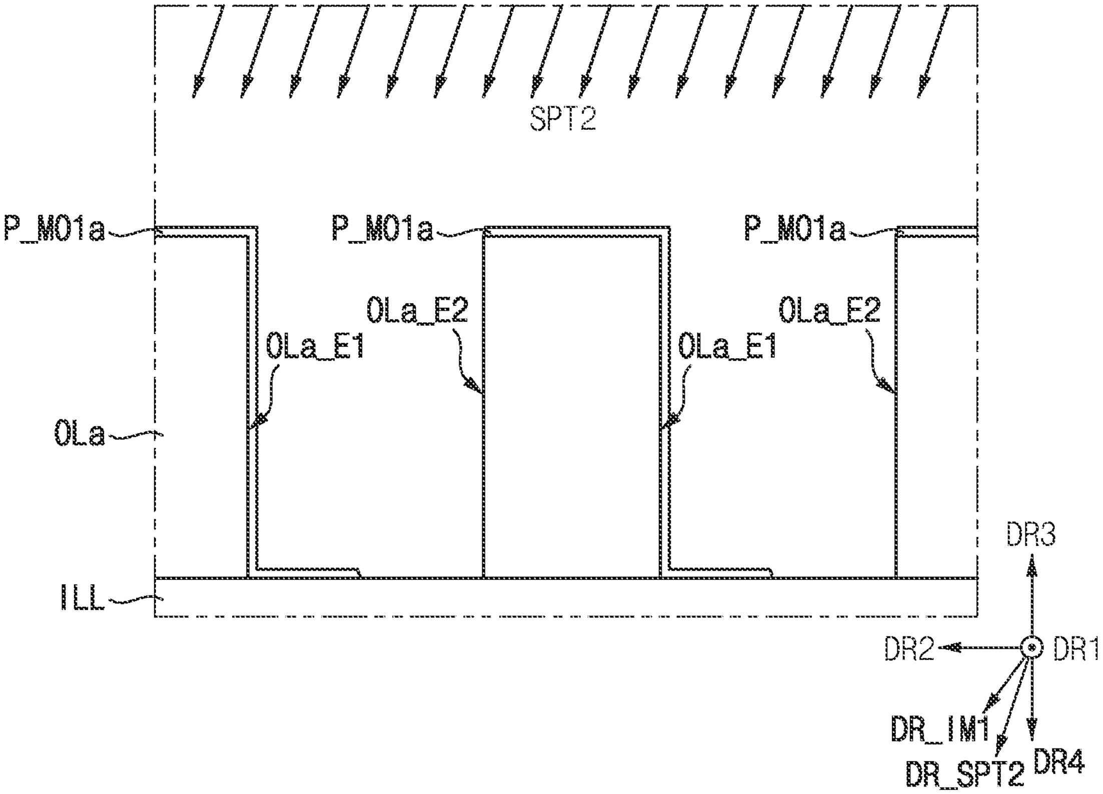
Figure 8:
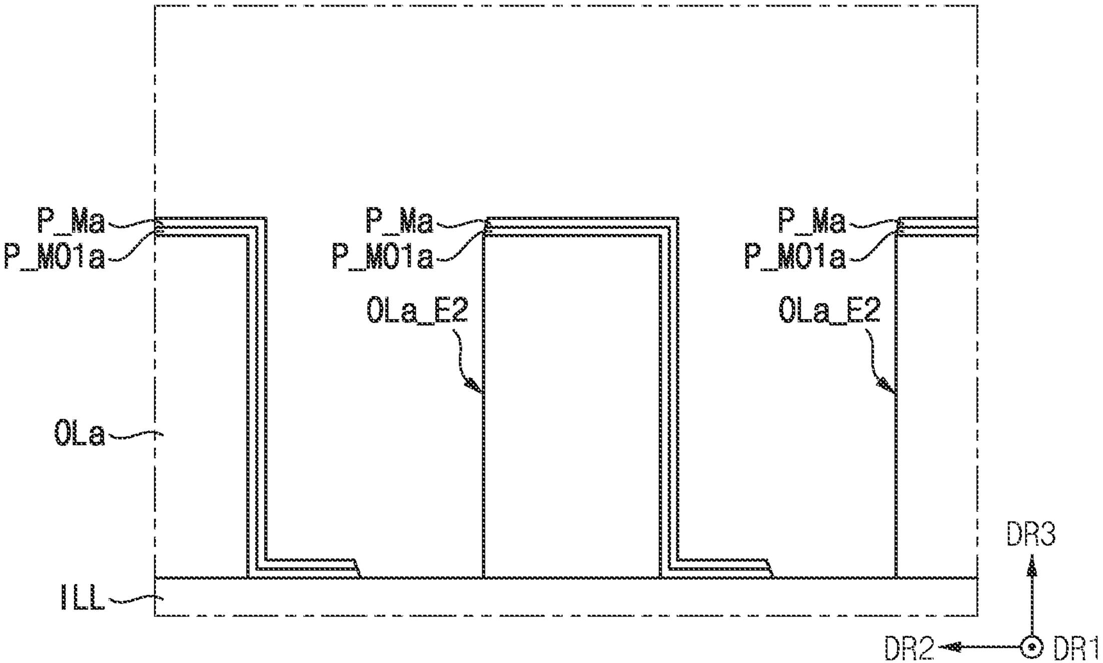

Referring to FIG. 7 and FIG. 8, the first preliminary metal layer P_Ma may be formed by second sputtering SPT2. The first preliminary metal layer P_Ma may include a metal. In an embodiment, for example, the first preliminary metal layer P_Ma may include copper, titanium, or molybdenum.

In the second sputtering SPT2, particles emitted from a sputtering target may proceed in a second sputtering direction DR SPT2. That is, the second sputtering SPT2 may be an oblique sputtering.

The second sputtering direction DR SPT2 may be a direction between the fourth direction DR4 and the extending direction DR_IM1 of the first imaginary line IML1. In an embodiment, the second sputtering direction DR SPT2 may be substantially the same as the first sputtering direction DR_SPT1. Accordingly, the first preliminary metal layer P_Ma formed by the second sputtering SPT2 may cover the first preliminary base metal oxide layer P_MO1*a* and may expose the second side surface OLa_E2.

In addition, since the first preliminary metal layer P_Ma is formed by the oblique sputtering, a thickness of the first preliminary metal layer P_Ma may be relatively uniform. In an embodiment, for example, a thickness of the first preliminary metal layer P_Ma in the direction perpendicular to the first side surface OLa_E1 in the area adjacent to the upper portion of the first side surface OLa_E1 (for example, A1 in FIG. 18) may be substantially the same as a thickness of first preliminary metal layer P_Ma in the direction perpendicular to the first side surface OLa_E1 in the area adjacent to the lower portion of the first side surface OLa_E1 (for example, A2 in FIG. 18).

Figure 9:
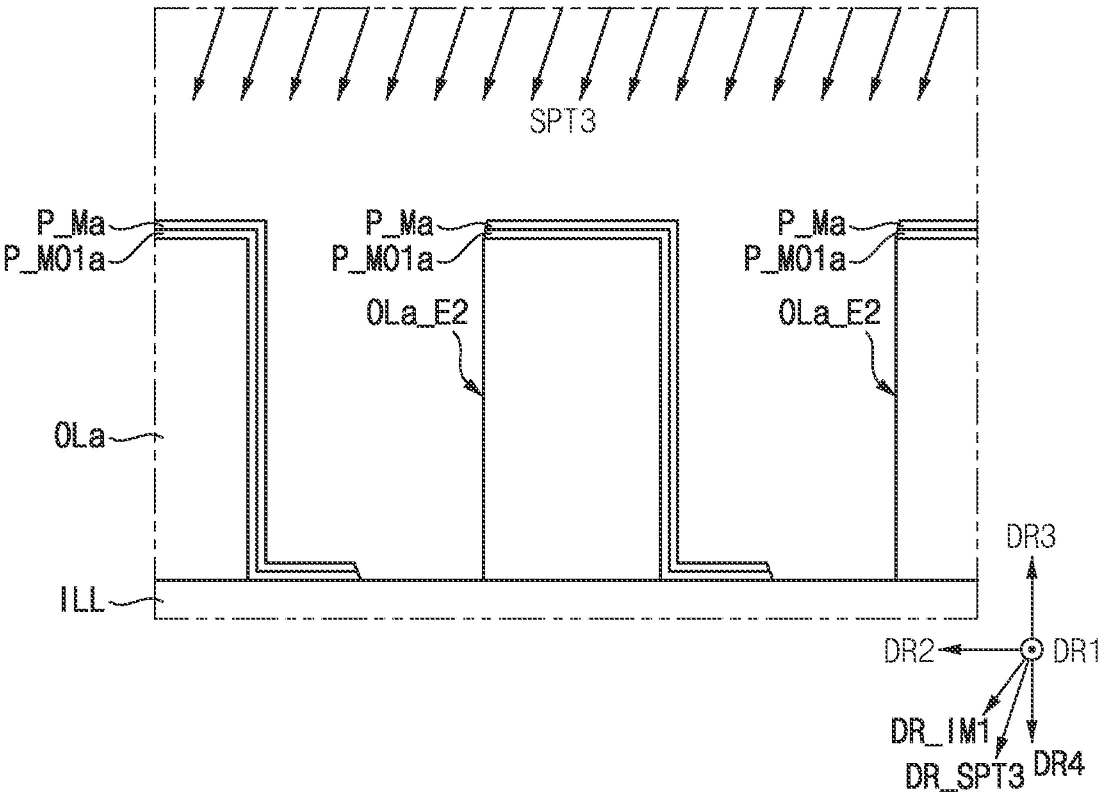
Figure 10:
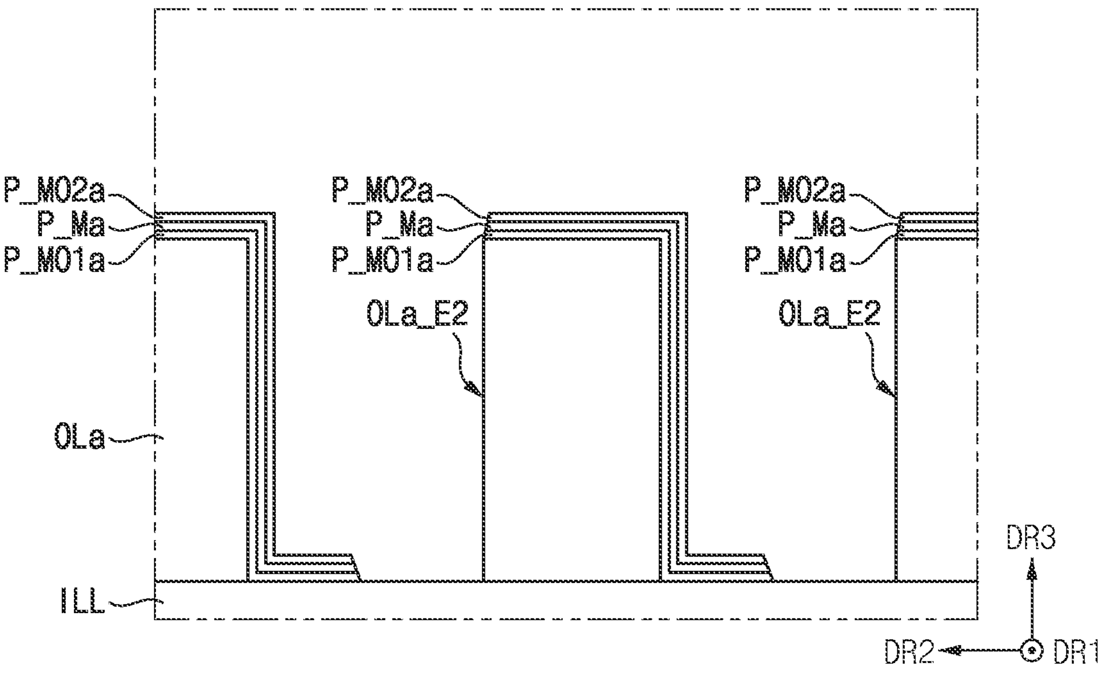

Referring to FIG. 9 and FIG. 10, the first preliminary cover metal oxide layer P_MO2*a* may be formed by a third sputtering SPT3. The first preliminary cover metal oxide layer P_MO2*a* may include a metal oxide. In an embodiment, for example, the first preliminary cover metal oxide layer P_MO2*a* may include copper oxide or molybdenum-tantalum oxide.

In the third sputtering SPT3, particles emitted from a sputtering target may proceed in a third sputtering direction DR_SPT3. That is, the third sputtering SPT3 may be an oblique sputtering.

The third sputtering direction DR_SPT3 may be a direction between the fourth direction DR4 and the extending direction DR_IM1 of the first imaginary line IML1. In an embodiment, the third sputtering direction DR_SPT3 may be substantially the same as the first sputtering direction DR_SPT1. Accordingly, the first preliminary cover metal oxide layer P_MO2*a* formed by the third sputtering SPT3 may cover the first preliminary metal layer P_Ma and may expose the second side surface OLa_E2.

In addition, since the first preliminary cover metal oxide layer P_MO2*a* is formed by the oblique sputtering, a thickness of the first preliminary cover metal oxide layer P_MO2*a* may be relatively uniform. In an embodiment, for example, a thickness of the first preliminary cover metal oxide layer P_MO2*a* in the direction perpendicular to the first side surface OLa_E1 in the area adjacent to the upper portion of the first side surface OLa_E1 (for example, A1 in FIG. 18) may be substantially the same as a thickness of first preliminary cover metal oxide layer P_MO2*a* in the direction perpendicular to the first side surface OLa_E1 in the area adjacent to the lower portion of the first side surface OLa_E1 (for example, A2 in FIG. 18).

The first preliminary base metal oxide layer P_MO1*a*, the first preliminary metal layer P_Ma, and the first preliminary cover metal layer P_MO2*a* may define the first preliminary low-reflection layer P_LCFa.

Hereinafter, an embodiment of a method of forming a second preliminary low-reflection layer P_LCFb will be described with reference to FIG. 11 to FIG. 16.

Figure 11:
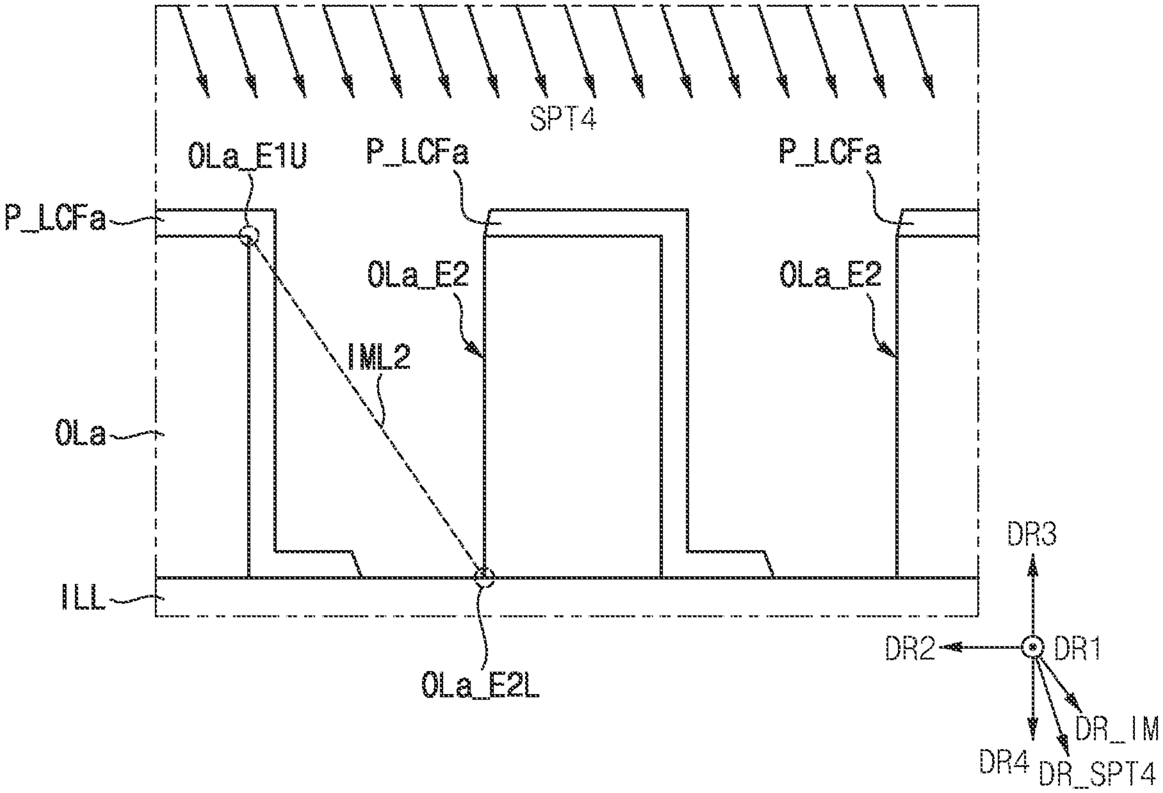
Figure 12:
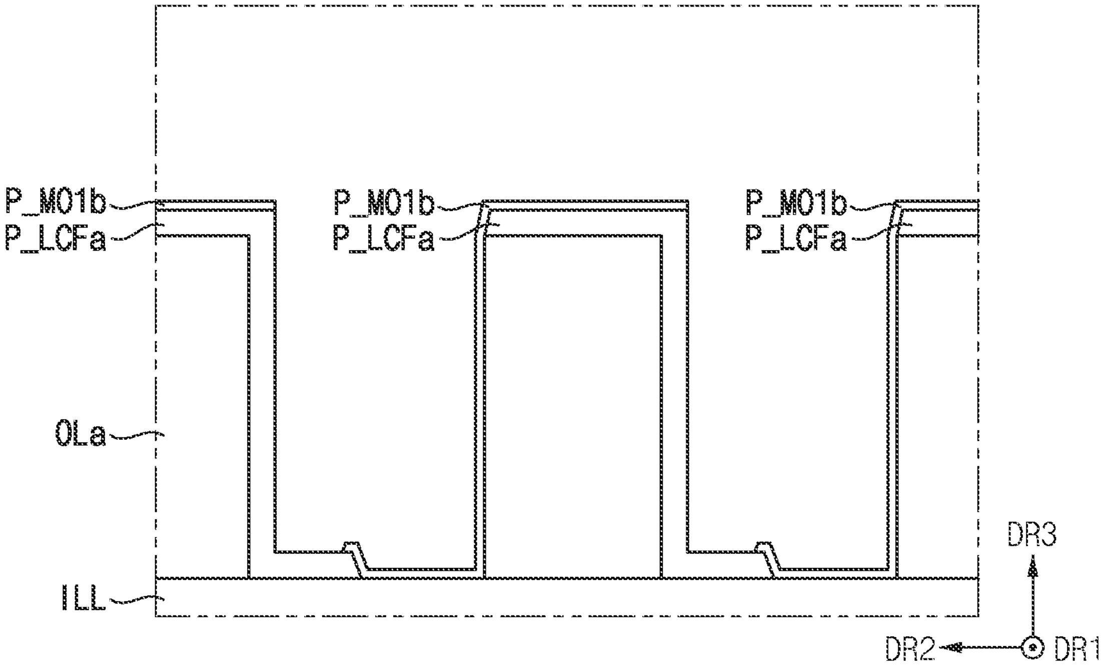

Referring to FIG. 11 and FIG. 12, the second preliminary base metal oxide layer P_MO1*b* may be formed by a fourth sputtering SPT4. The second preliminary base metal oxide layer P_MO1*b* may include a metal oxide. In an embodiment, for example, the second preliminary base metal oxide layer P_MO1*b* may include copper oxide or molybdenum-tantalum oxide.

In the fourth sputtering SPT4, particles emitted from a sputtering target may proceed in a fourth sputtering direction DR_SPT4. That is, the fourth sputtering SPT4 may be an oblique sputtering.

The fourth sputtering direction DR_SPT4 may be a direction between the fourth direction DR4 and an extending direction DR_IM2 of a second imaginary line IML2. The second imaginary line ILM2 may be a line extending from an upper edge OLa_E1U of the first side surface OLa_E1 to a lower edge OLa_E2L of the second side surface OLa_E2. Accordingly, the second preliminary base metal oxide layer P_MO1*b* formed by the fourth sputtering SPT4 may substantially completely cover the second surface OLa_E2, and may expose the first preliminary low-reflection layer P_LCFa covering the first side surface OLa_E1. In such an embodiment, the second preliminary base metal oxide layer P_MO1*b* may further cover the upper surface of the first organic layer OLa and another portion of the upper surface of the barrier layer ILL exposed by the opening OLa_OP.

In an embodiment, the upper surface of the barrier layer ILL exposed by the opening OLa_OP may be substantially completely covered by the first preliminary low-reflection layer P_LCFa and the second preliminary base metal oxide layer P_MO1*b*. In an embodiment, for example, as shown in FIG. 12, the second preliminary base metal oxide layer P_MO1*b* may further cover the first preliminary low-reflection layer P_LCFa covering the portion of the upper surface of the barrier layer ILL exposed by the opening OLa_OP, and accordingly, the upper surface of the barrier layer ILL exposed by the opening OLa_OP may be substantially completely covered by the first preliminary low-reflection layer P_LCFa and the second preliminary base metal oxide layer P_MO1*b*.

Since the second preliminary base metal oxide layer P_MO1*b* is formed by the oblique sputtering, the second preliminary base metal oxide layer P_MO1*b* may have a relatively uniform thickness. In an embodiment, for example, a thickness of the second preliminary base metal oxide layer P_MO1*b* in a direction perpendicular to the second side surface OLa_E2 in an area adjacent to an upper portion of the second side surface OLa_E2 (for example, B1 in FIG. 18) may be substantially the same as a thickness of the second preliminary base metal oxide layer P_MO1*b* in the direction perpendicular to the second side surface OLa_E2 in an area adjacent to a lower portion of the second side surface OLa_E2 (for example, B2 in FIG. 18).

Figure 13:
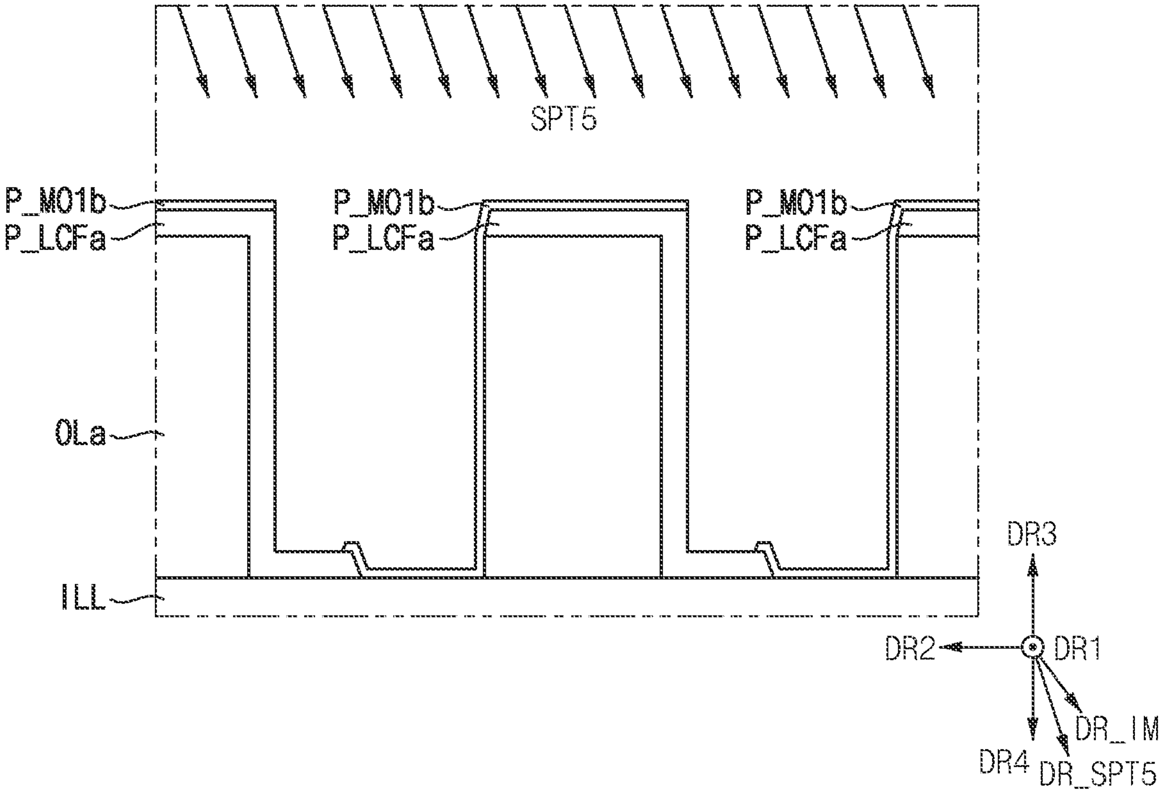
Figure 14:
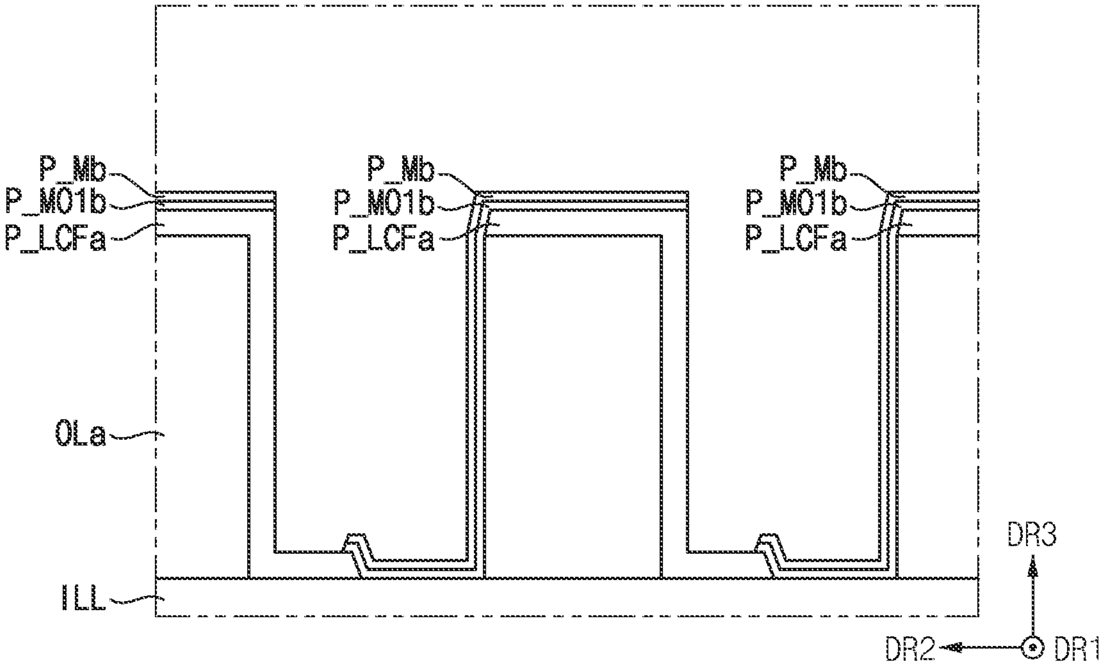

Referring to FIG. 13 and FIG. 14, a second preliminary metal layer P_Mb may be formed by a fifth sputtering SPT5. The second preliminary metal layer P_Mb may include a metal. In an embodiment, for example, the second preliminary metal layer P_Mb may include copper, titanium, or molybdenum.

In the fifth sputtering SPT5, particles emitted from a sputtering target may proceed in a fifth sputtering direction DR_SPT5. That is, the fifth sputtering SPT5 may be an oblique sputtering.

The fifth sputtering direction DR_SPT5 may be a direction between the fourth direction DR4 and the extending direction DR_IM2 of the second imaginary line IML2. In an embodiment, the fifth sputtering direction DR_SPT5 may be substantially same as the fourth sputtering direction DR_SPT4. Accordingly, the second preliminary metal layer P_Mb formed by the fifth sputtering SPT5 may cover the second preliminary base metal oxide layer P_MO1*b* and may expose the first preliminary low-reflection layer P_LCFa covering the first side surface OLa_E1.

In addition, since the second preliminary metal layer P_Mb is formed by the oblique sputtering, a thickness of the second preliminary metal layer P_Mb may be relatively uniform. In an embodiment, for example, a thickness of the second preliminary metal layer P_Mb in the direction perpendicular to the second side surface OLa_E2 in the area adjacent to the upper portion of the second side surface OLa_E2 (for example, B1 in FIG. 18) may be substantially the same as a thickness of the second preliminary metal layer P_Mb in the direction perpendicular to the second side surface OLa_E2 in the area adjacent to the lower portion of the second side surface OLa_E2 (for example, B2 in FIG. 18).

Figure 15:
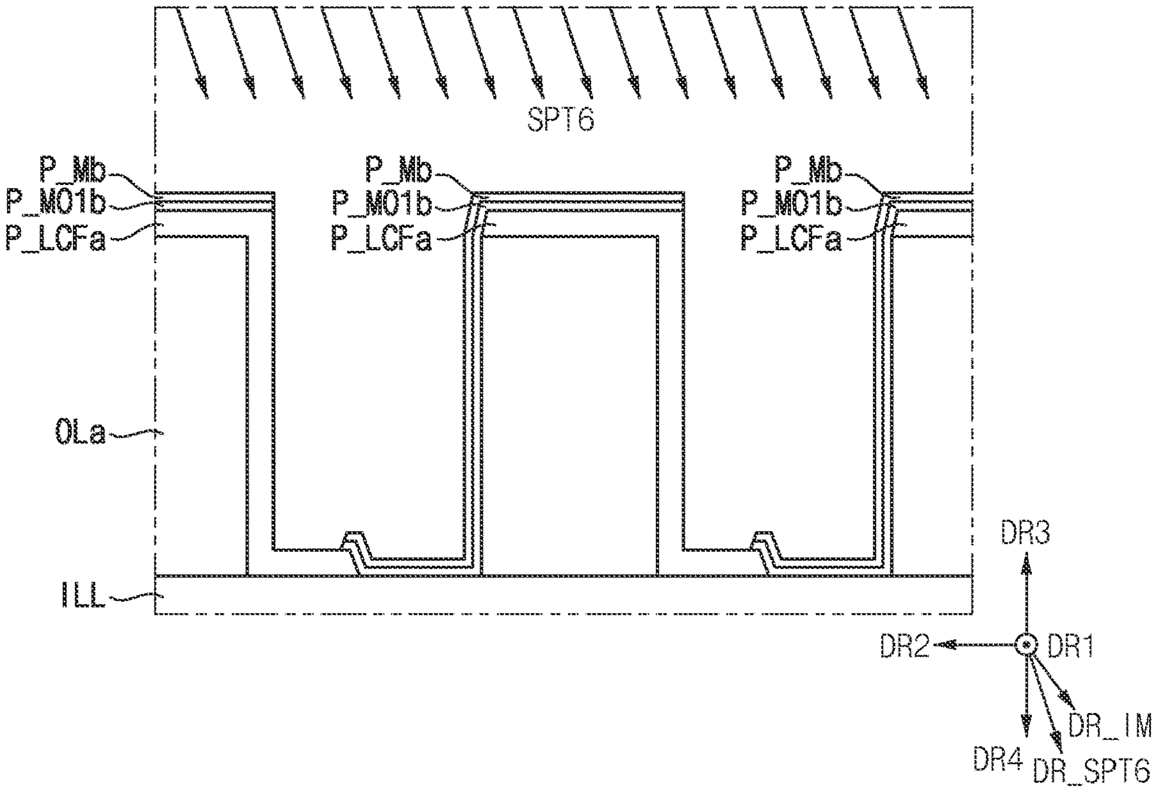
Figure 16:
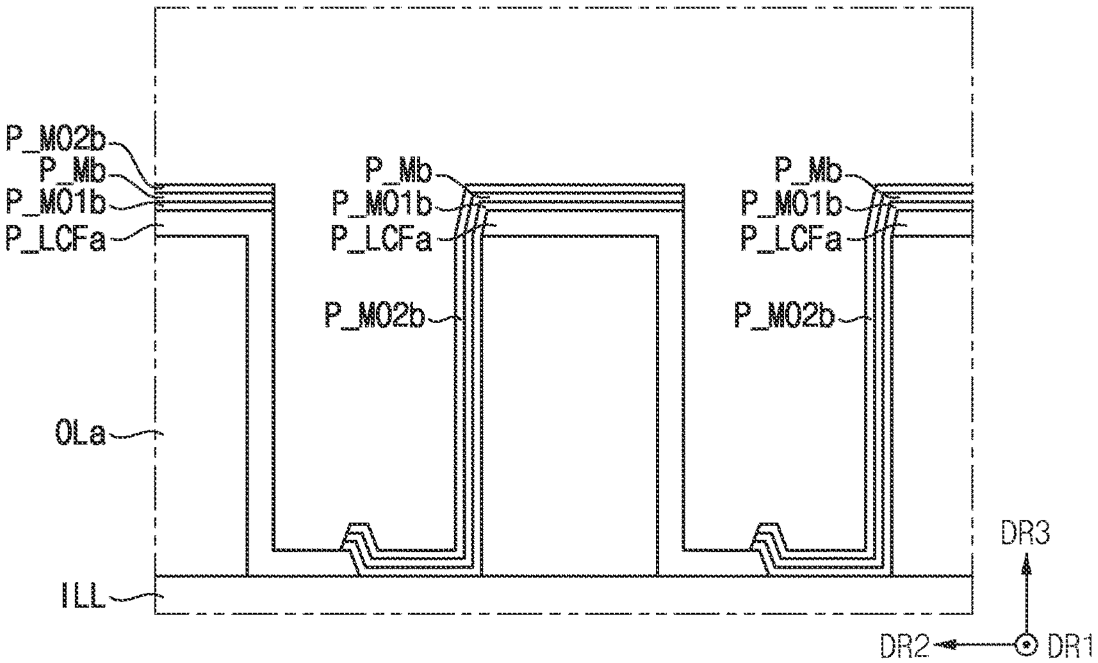

Referring to FIG. 15 and FIG. 16, the second preliminary cover metal oxide layer P_MO2*b* may be formed by a sixth sputtering SPT6. The second preliminary cover metal oxide layer P_MO2*b* may include a metal oxide. In an embodiment, for example, the second preliminary cover metal oxide layer P_MO2*b* may include copper oxide or molybdenum-tantalum oxide.

In the sixth sputtering SPT6, particles emitted from a sputtering target may proceed in a sixth sputtering direction DR_SPT6. That is, the sixth sputtering SPT6 may be an oblique sputtering.

The sixth sputtering direction DR_SPT6 may be a direction between the fourth direction DR4 and the extending direction DR_IM2 of the second imaginary line IML2. In an embodiment, the sixth sputtering direction DR_SPT6 may be substantially same as the fourth sputtering direction DR_SPT4. Accordingly, the second preliminary cover metal oxide layer P_MO2*b* formed by the third sputtering SPT3 may cover the second preliminary metal layer P_Mb and may expose the first preliminary low-reflection layer P_LCFa covering the first side surface OLa_E1.

In addition, since the second preliminary cover metal oxide layer P_MO2*b* is formed by the oblique sputtering, a thickness of the second preliminary cover metal oxide layer P_MO2*b* may be relatively uniform. In an embodiment, for example, a thickness of the second preliminary cover metal oxide layer P_MO2*b* in the direction perpendicular to the second side surface OLa_E2 in the area adjacent to the upper portion of the second side surface OLa_E2 (for example, B1 in FIG. 18) may be substantially the same as a thickness of second preliminary cover metal oxide layer P_MO2*b* in the direction perpendicular to the second side surface Ola_E2 in the area adjacent to the lower portion of the second side surface Ola_E2 (for example, B2 in FIG. 18).

The second preliminary base metal oxide layer P_MO1*b*, the second preliminary metal layer P_Mb, and the second preliminary cover metal layer P_MO2*b* may define the second preliminary low-reflection layer P_LCFb.

Hereinafter, an embodiment of a method of forming the low-reflection barrier LCF will be described with reference to FIG. 17 and FIG. 18.

Figure 17:
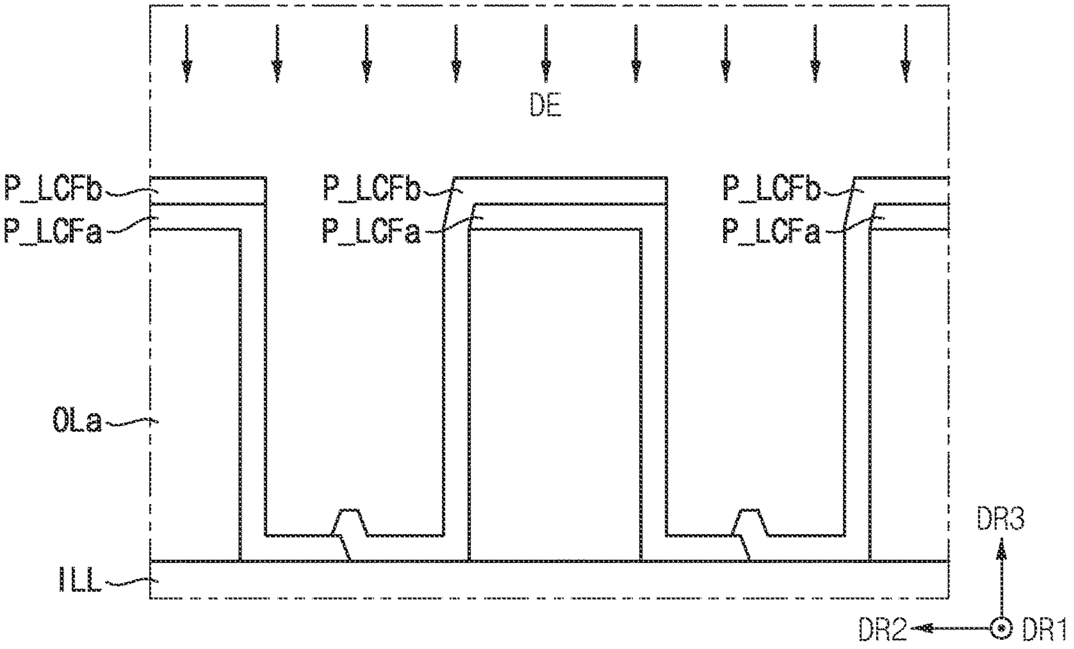
Figure 18:
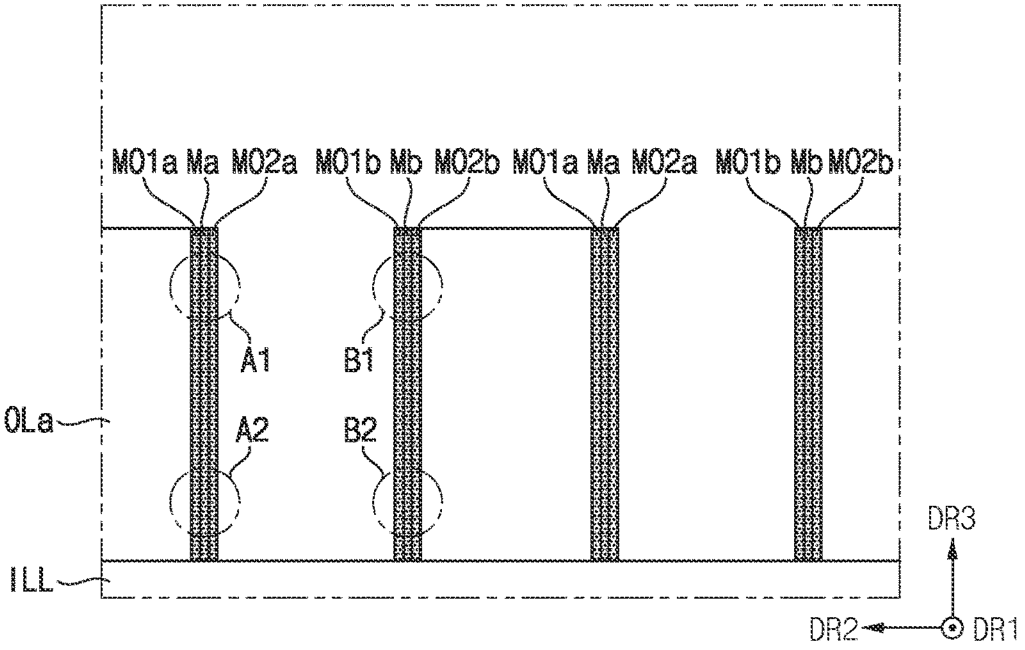
Figure 19:
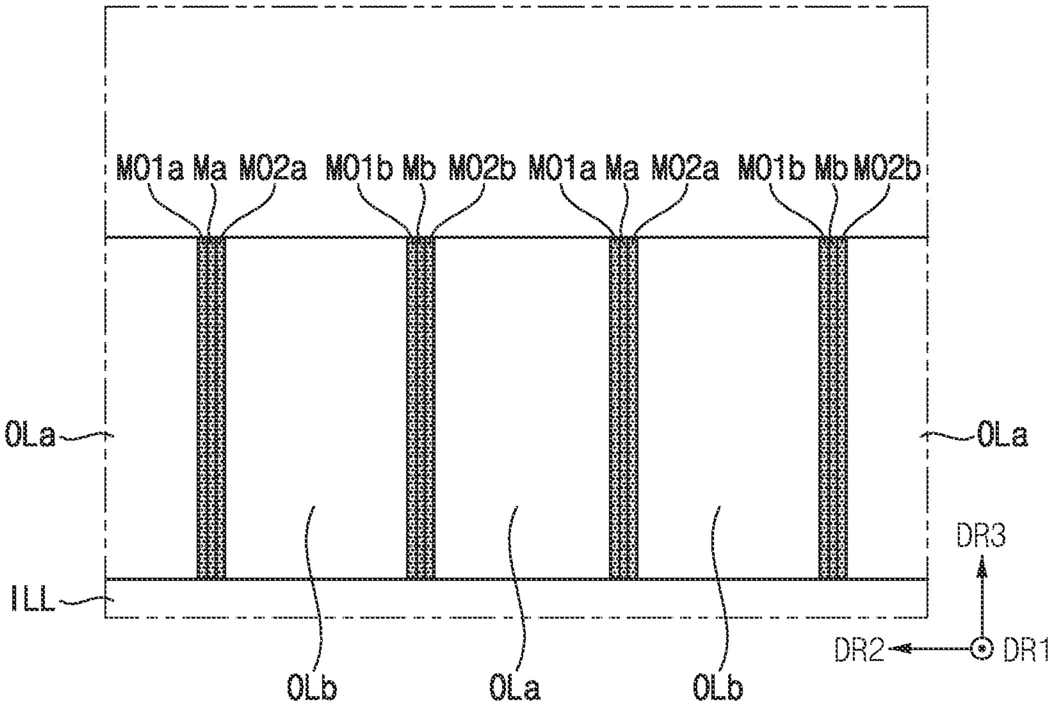

Referring to FIG. 17 and FIG. 18, a first low-reflection barrier LCFa and a second low-reflection barrier LCFb may be formed by anisotropic dry etching DE on the first preliminary low-reflection layer P_LCFa and the second preliminary low-reflection layer LCFb. In such an embodiment, the first low-reflection barrier LCFa and the second low-reflection barrier LCFb may define the low-reflection barrier LCF.

Dry etching is an etching process using a reaction by gas plasma or activated gas. The anisotropic dry etching DE is a dry etching process having an etching direction. In an embodiment of the invention, the etching direction of the anisotropic dry etching DE may be the fourth direction DR4.

Accordingly, the first preliminary low-reflection layer P_LCFa overlapping the upper surface of the first organic layer OLa, the second preliminary low-reflection layer P_LCFb overlapping the upper surface of the first organic layer OLa, the first preliminary low-reflection layer P_LCFa overlapping the upper surface of the barrier layer ILL exposed by the opening OLa_OP, and the second preliminary low-reflection layer P_LCFb overlapping the upper surface of the barrier layer ILL exposed by the opening OLa_OP may be removed by the anisotropic dry etching DE.

In such an embodiment, a portion of the first preliminary low-reflection layer P_LCFa and a portion of the second preliminary low-reflection layer P_LCFb except for other portion of the first preliminary low-reflection layer P_LCFa covering the first side surface OLa_E1 and other portion of the second preliminary low-reflection layer P_LCFb covering the second side surface OLa_E2 may be removed by the anisotropic dry etching DE. In this case, the other portion of the first preliminary low-reflection layer P_LCFa covering the first side surface OLa_E1 may form the first low-reflection barrier LCFa, and the other portion of the second preliminary low-reflection layer P_LCFb covering the second side surface OLa_E2 may form the second low-reflection layer LCFb.

The first low-reflection LCFa may include a first base metal oxide layer MO1*a*, a first metal layer Ma, and a first cover metal oxide layer MO2*a*. The first base metal oxide layer MO1*a*, the first metal layer Ma, and the first cover metal oxide layer MO2*a* may be a portion of the first preliminary base metal oxide layer P_MO1*a*, a portion of the first preliminary metal oxide layer P_Ma, and a portion of the first preliminary cover metal oxide layer P_MO2*a* not removed by the anisotropic dry etching DE. The first base metal oxide layer MO1*a*, the first metal layer Ma, and the first cover metal oxide layer MO2*a* may cover the first side surface OLa_E1 in sequence.

The second low-reflection LCFb may include a second base metal oxide layer MO1*b*, a second metal layer Mb, and a second cover metal oxide layer MO2*b*. The second base metal oxide layer MO1*b*, the second metal layer Mb, and the second cover metal oxide layer MO2*b* may be a portion of the second preliminary base metal oxide layer P_MO1*b*, a portion of the second preliminary metal oxide layer P_Mb, and a portion of the second preliminary cover metal oxide layer P_MO2*b* not removed by the anisotropic dry etching DE. The second base metal oxide layer MO1*b*, the second metal layer Mb, and the second cover metal oxide layer MO2*b* may cover the second side surface OLa_E2 in sequence.

In an embodiment, as shown in FIG. 17, the first preliminary low-reflection layer P_LCFa and the second preliminary low-reflection layer P_LCFb may substantially completely cover the upper surface of the barrier layer ILL exposed by the opening OLa_OP. Accordingly, the first preliminary low-reflection layer P_LCFa and the second preliminary low-reflection layer P_LCFb may protect the barrier layer ILL from the anisotropic dry etching DE, and accordingly, the barrier layer ILL may not be removed by the anisotropic dry etching DE.

In an embodiment, as described with reference to FIG. 5 to FIG. 10, each of the first preliminary base metal oxide layer P_MO1*a*, the first preliminary metal layer P_Ma, and the first preliminary cover metal oxide layer MO2*a* may have a relatively uniform thickness. Accordingly, each of the first base metal oxide layer MO1*a*, the first metal layer Ma, and the first cover metal oxide layer MO2*a* may have a relatively uniform thickness.

In an embodiment, a thickness of each of the first base metal oxide layer MO1*a*, the first metal layer Ma, and the first cover metal oxide layer MO2*a* in the direction perpendicular to the first side surface OLa_E1 in the area A1 adjacent to the upper portion of the first side surface OLa_E1 may be substantially the same as a thickness of each of the first base metal oxide layer MO1*a*, the first metal layer Ma, and the first cover metal oxide layer MO2*a* in the direction perpendicular to the first side surface OLa_E1 in the area A2 adjacent to the lower portion of the first side surface OLa_E1.

Accordingly, in an embodiment of the invention, a thickness of the first low-reflection barrier LCFa in the direction perpendicular to the first side surface OLa_E1 in the area A1 adjacent to the upper portion of the first side surface OLa_E1 may be substantially the same as a thickness of the first low-reflection barrier LCFa in the direction perpendicular to the first side surface OLa_E1 in the area A2 adjacent to the lower portion of the first side surface OLa_E1. In an embodiment, the thickness of the first low-reflection barrier LCFa in the direction perpendicular to the first side surface OLa_E1 in the area A2 adjacent to the lower portion of the first side surface OLa_E1 may be more than about 95% and less than about 100% of the thickness of the first low-reflection barrier LCFa in the direction perpendicular to the first side surface OLa_E1 in the area A1 adjacent to the upper portion of the first side surface OLa_E1.

As the first low-reflection barrier LCFa has a relatively uniform thickness, the first low-reflection barrier LCFa may have a relatively uniform reflectance, and at the same time, the first low-reflection barrier LCFa may have an optimal low-reflection characteristic.

In a case, for example, where the first base metal oxide layer MO1*a* or the first cover metal oxide layer MO1*b* includes molybdenum-tantalum oxide, and a thickness of the first base metal oxide layer MO1*a* or the first cover metal oxide layer MO1*b* is about 450 angstroms, the first base metal oxide layer MO1*a* or the first cover metal oxide layer MO1*b* has a reflectance of about 10% or less with respect to visible light. However, in this case, if the thickness of the first base metal oxide layer MO1*a* or the first cover metal oxide layer MO1*b* is less than 400 angstroms or more than 500 angstroms, the first base metal oxide layer MO1*a* or the first cover metal oxide layer MO1*b* has a reflectance of more than about 10% with respect to visible light.

In an embodiment of the invention, the first base metal oxide layer MO1*a* and the first cover metal oxide layer MO1*b* may be uniformly formed so that the first base metal oxide layer MO1*a* and the first cover metal oxide layer MO1*b* has an optimal thickness (for example, about 450 angstroms) that may have a relatively low reflectance. Accordingly, the first low-reflection barrier LCFa may have a relatively low reflectance. That is, light blocking efficiency of the first low-reflection barrier LCFa may be improved.

In such an embodiment, as described with reference to FIG. 11 to FIG. 16, each of the second preliminary base metal oxide layer P_MO1*b*, the second preliminary metal layer P_Mb, and the second preliminary cover metal oxide layer P_MO2*b* may have a relatively uniform thickness. Accordingly, the second base metal oxide layer MO1*b*, the second metal layer Mb, and the second cover metal oxide layer MO2*b* may also have a relatively uniform thickness. Accordingly, the second low-reflection barrier LCFb may also have a relatively low reflectance.

Figure 20:
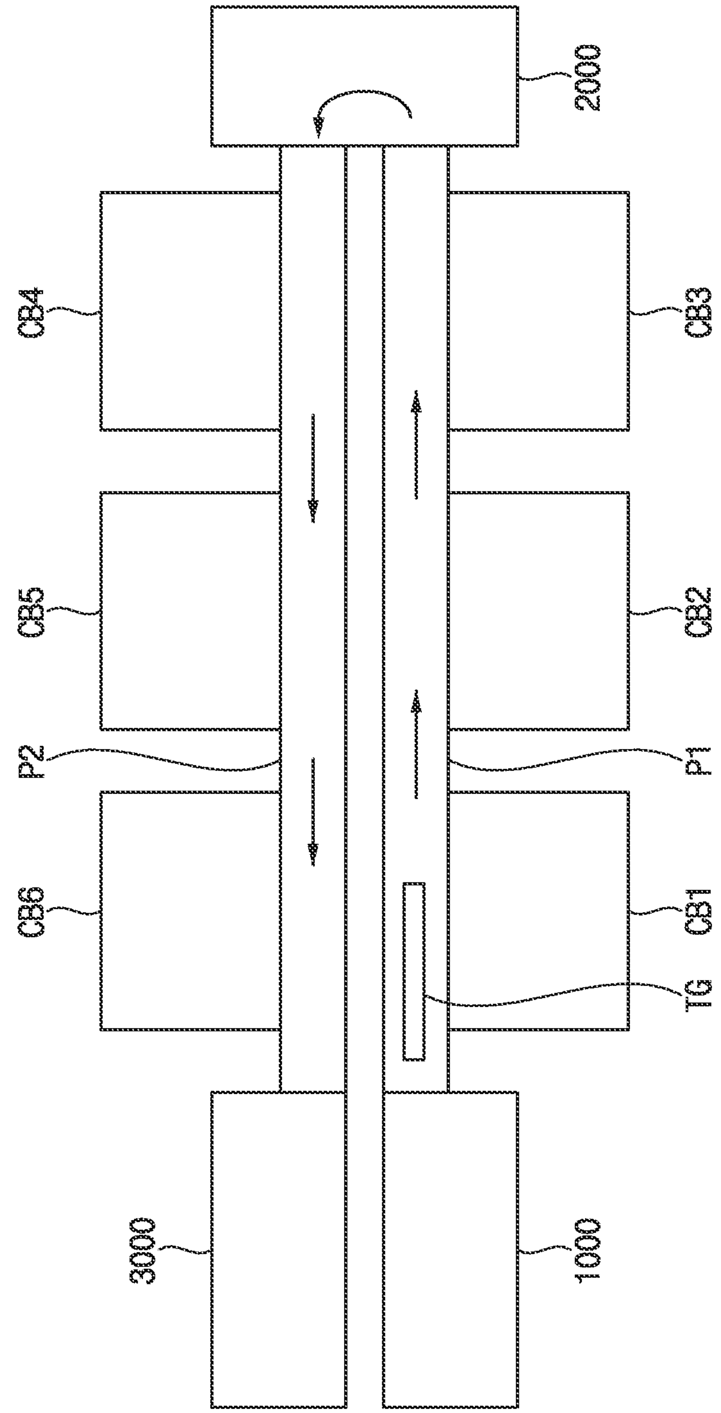
FIG. 20 to FIG. 22 are diagrams illustrating an embodiment of a sputtering apparatus for manufacturing the display device of FIG. 1.
Figure 21:
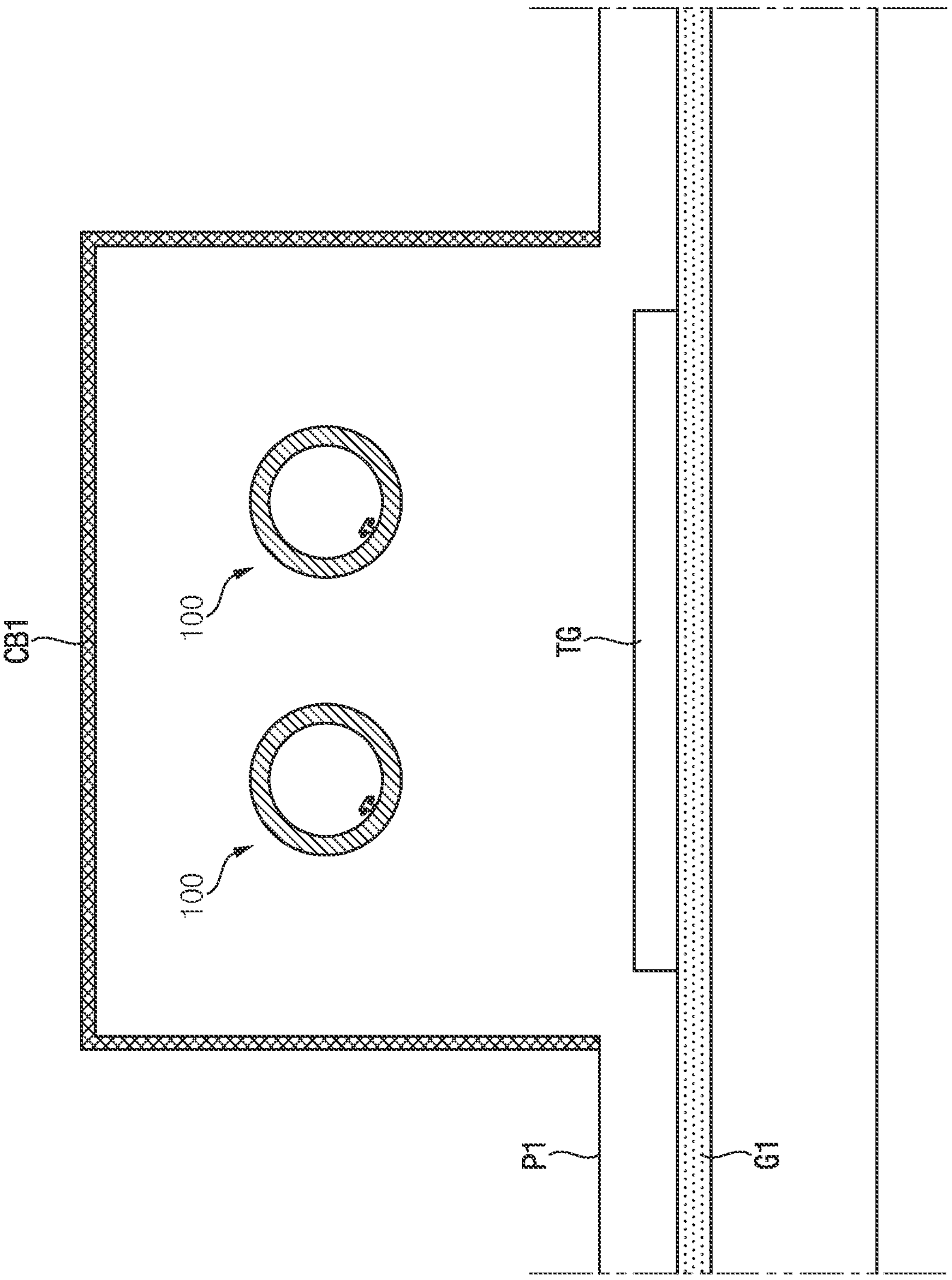
Figure 22:
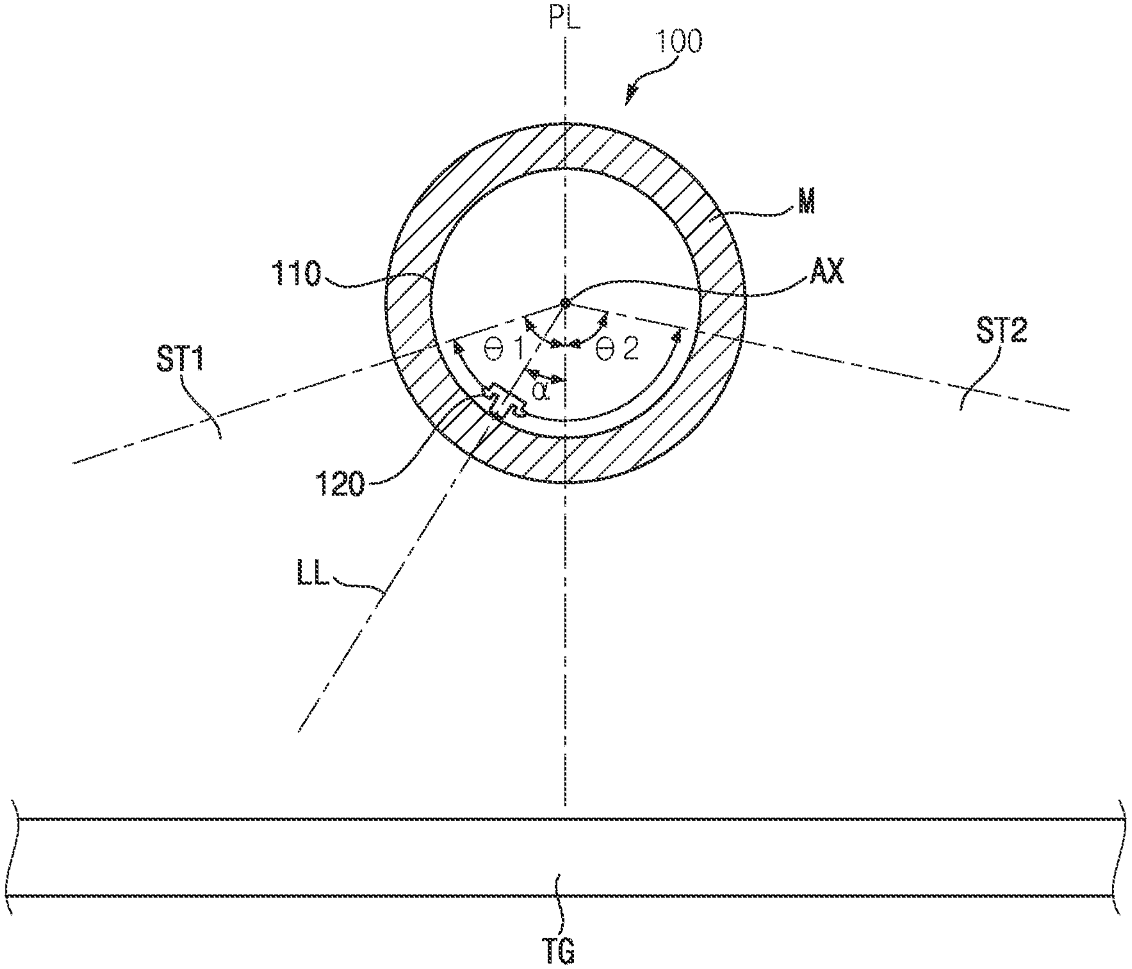

FIG. 20 to FIG. 22 are diagrams illustrating a sputtering apparatus for manufacturing the display device of FIG. 1.

Referring to FIG. 20, an embodiment of the sputtering apparatus may include a target substrate loading unit 1000, a first path unit P1, a target substrate rotation unit 2000, a second path unit P2, a target substrate unloading unit 3000, and first to sixth chambers CB1, CB2, CB3, CB4, CB5, and CB6.

A target substrate TG may be loaded in the target substrate loading unit 1000. In an embodiment, the target substrate TG may include the substrate SUB, the circuit layer CIR, the first electrode E1, the light emitting layer EL, the pixel defining layer PDL, the second electrode E2, the first encapsulation layer EN1, the second encapsulation layer EN2, the third encapsulation layer EN3, and the barrier layer ILL described with reference to FIG. 2, and the first organic layer OLa described with reference to FIG. 4 may be disposed on the barrier layer ILL.

The target substrate TG loaded in the target substrate loading unit 1000 may move through the first path unit P1. In an embodiment, the target substrate TG may pass through the first chamber CB1, the second chamber CB2, and the third chamber CB3 in sequence. In the first chamber CB1, the first sputtering SPT1 described with reference to FIG. 5 and FIG. 6 may be processed. In the second chamber CB2, the second sputtering SPT2 described with reference to FIG. 7 and FIG. 8 may be processed. In the third chamber CB3, the third sputtering SPT3 described with reference to FIG. 9 and FIG. 10 may be processed.

After the first to third sputtering SPT1, SPT2, and SPT3, the target substrate TG may be rotated in the target substrate rotation unit 2000, and then may move through the second path unit P2, such that the target substrate TG may pass through the fourth chamber CB4, the fifth chamber CB5, and the sixth chamber CB6 in sequence. In the fourth chamber CB4, the fourth sputtering SPT4 described with reference to FIG. 11 and FIG. 12 may be processed. In the fifth chamber CB5, the fifth sputtering SPT5 described with reference to FIG. 13 and FIG. 14 may be processed. In the sixth chamber CB6, the sixth sputtering SPT6 described with reference to FIG. 15 and FIG. 16 may be processed.

After the fourth to sixth sputtering SPT4, SPT5, and SPT6, the target substrate TG may move toward the target substrate unloading unit 3000, and then, in the target substrate unloading unit 3000, the target substrate TG may be unloaded. After unloading of the target substrate TG, processes described with reference to FIG. 17 to FIG. 18 may be processed.

As described above, in an embodiment of the sputtering apparatus, the sputtering process SPT1, SPT2, SPT3, SPT4, SPT5, and SPT6 described with reference to FIG. 5 to FIG. 16 may be processed on the target substrate TG through one loading and one unloading. Accordingly, since the target substrate TG may not be exposed to the external environment during the sputtering process SPT1, SPT2, SPT3, SPT4, SPT5, and SPT6, contamination of the target substrate TG may be effectively prevented. In addition, process efficiency may be improved by minimizing the number of loading and unloading of the target substrate TG.

Hereinafter, the first sputtering SPT1 processed in the first chamber CB1 will be described with reference to FIG. 21 and FIG. 22. The second to sixth sputtering SPT2, SPT3, SPT4, SPT5, and SPT6 processed in the second to sixth chambers CB2, CB3, CB4, CB5, and CB6 may be substantially the same as (or similar to) the first sputtering SPT1 processed in the first chamber CB1. Accordingly, for convenience of description, any repetitive detailed description of the second to sixth sputtering SPT2, SPT3, SPT4, SPT5, and SPT6 processed in the second to sixth chambers CB2, CB3, CB4, CB5, and CB6 will be omitted.

Referring to FIG. 21 and FIG. 22, a cathode assembly 100 may be disposed in the first chamber CB1. The cathode assembly 100 may be provided in plural in the first chamber CB1. In an embodiment, for example, two cathode assemblies 100 may be disposed in the first chamber CB1. However, the invention is not limited thereto. In an alternative embodiment, for example, more than three cathode assemblies 100 may be disposed in the first chamber CB1.

The cathode assembly 100 may have a cylindrical shape, and may extend in the first direction DR1 which is an extending direction of the opening OLa_OP formed in the first organic layer OLa. The cathode assembly 100 may include a cylindrical target M, a backing tube 110, and a magnet 120.

The cylindrical target M including a material to be deposited on the target substrate TG may be disposed on a surface of the cathode assembly 100. In an embodiment, for example, the cylindrical target M may include a same material as the metal included in the first preliminary base metal oxide layer P_MO1*a*. In this case, in the first sputtering SPT1, the cylindrical target M separated from the cathode assembly 100 may be physically and/or chemically bonded to oxygen in the first chamber CB1 to form the first preliminary base metal oxide layer P_MO1*a*.

The backing tube 110 may be disposed in the cathode assembly 100. The backing tube 110 may have a cylindrical shape, and may be disposed in an inner surface defined by the cathode assembly 100. The backing tube 110 may extend in the first direction DR1. An outer surface of the backing tube 110 and an inner surface of the cylindrical target M may directly contact each other.

The magnet 120 may include N type magnet and S type magnet. Each of the N type magnet and the S type magnet may be provided in plural. The magnet 120 may have a bar shape extending in the first direction DR1.

The magnet 120 may move in the inner space of the cathode assembly 100. In an embodiment, for example, the magnet 120 may rotate around the rotation axis AX. More specifically, the magnet 120 may move by a first angle $\theta 1$ in a clockwise direction with respect to a vertical plane PL perpendicular to each of the first and second directions DR1 and DR2. That is, the magnet 120 may freely move within a first sector ST1 located on one side of the vertical plane PL. In addition, the magnet 120 may move by a second angle $\theta 2$ in a counterclockwise direction with respect to the vertical plane PL. That is, the magnet 120 may move freely even within a second sector ST2 located on the other side of the vertical plane PL.

During the first sputtering SPT1, a location of the magnet 120 may be fixed. Specifically, an angle $\alpha$ between an extension line LL extending from the rotation axis AX toward the magnet 120 and the vertical plane PL may be constant. In this case, the angle $\alpha$ may be substantially the same as the angle between the fourth direction DR4 and the first sputtering direction DR_SPT1 described with reference to FIG. 5. Accordingly, particles emitted from the cylindrical target M may proceed in the first sputtering direction DR_SPT1.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display device, the method comprising:
   - forming a barrier layer on a light emitting element;
   - forming a first organic layer defining an opening exposing a portion of the barrier layer and overlapping the light emitting element in a plan view on the barrier layer;
   - forming a first preliminary low-reflection layer covering a first side surface of the first organic layer defining the opening and an upper surface of the first organic layer;
   - forming a second preliminary low-reflection layer covering a second side surface of the first organic layer defining the opening and opposite to the first side surface and the upper surface of the first organic layer;
   - forming a low-reflection barrier covering the first side surface and the second side surface defining the opening by anisotropic dry etching of the first preliminary low-reflection layer and the second preliminary low-reflection layer; and
   - forming a second organic layer filling the opening of the first organic layer,
   - wherein the forming the second preliminary low-reflection layer comprises:
   - forming a second preliminary base metal oxide layer covering the second side surface defining the opening and the first preliminary low-reflection layer covering the upper surface of the first organic layer;
   - forming a second preliminary metal layer covering the second preliminary base metal oxide layer; and
   - forming a second preliminary cover metal oxide layer covering the second preliminary metal layer.

2. The method of claim 1, wherein
   - the first preliminary low-reflection layer exposes the second side surface defining the opening, and
   - the second preliminary low-reflection layer exposes the first preliminary low-reflection layer covering the first side surface defining the opening.

3. The method of claim 1, wherein
   - the first preliminary low-reflection layer covers the first side surface defining the opening and one portion of an upper surface of the portion of the barrier layer, and
   - the second preliminary low-reflection layer covers the second side defining the opening and a remaining portion of the upper surface of the portion of the barrier layer.

4. The method of claim 3, wherein the second preliminary low-reflection layer further covers at least a portion of the first preliminary low-reflection layer covering the one portion of the upper surface of the portion of the barrier layer.

5. The method of claim 3, wherein the upper surface of the portion of the barrier layer exposed by the opening is completely covered by the first preliminary low-reflection layer and the second preliminary low-reflection layer.

6. The method of claim 3, wherein the first preliminary low-reflection layer covering the one portion of the upper surface of the portion of the barrier layer and the second preliminary low-reflection layer covering the remaining portion of the upper surface of the portion of the barrier layer are removed by the anisotropic dry etching.

7. The method of claim 1, wherein a portion of the first preliminary low-reflection layer overlapping the upper surface of the first organic layer and a portion of the second preliminary low-reflection layer overlapping the upper surface of the first organic layer are removed by the anisotropic dry etching.

8. The method of claim 1, wherein the opening defined by the first organic layer is provided in plural, and each of the openings extends in a first direction in a plan view, and the openings are arranged along a second direction crossing the first direction in the plan view, and the light emitting element overlaps at least one selected from the openings in the plan view.

9. The method of claim 1, wherein a thickness of the low-reflection barrier in a direction perpendicular to the first side surface defining the opening in an area adjacent to a lower portion of the first side surface defining the opening is more than 95% and less than 100% of a thickness of the low-reflection barrier in the direction perpendicular to the first side surface defining the opening in an area adjacent to an upper portion of the first side surface defining the opening, and a thickness of the low-reflection barrier in a direction perpendicular to the second side surface defining the opening in an area adjacent to a lower portion of the second side surface defining the opening is more than 95% and less than 100% of a thickness of the low-reflection barrier in the direction perpendicular to the second side surface defining the opening in an area adjacent to an upper portion of the second side surface defining the opening.

10. The method of claim 1, wherein the forming the first preliminary low-reflection layer comprises:

forming a first preliminary base metal oxide layer covering the first side surface defining the opening and the upper surface of the first organic layer;

forming a first preliminary metal layer covering the first preliminary base metal oxide layer; and forming a first preliminary cover metal oxide layer covering the first preliminary metal layer.

11. The method of claim 1, wherein each of the first preliminary base metal oxide layer, the second preliminary base metal oxide layer, the first preliminary cover metal oxide layer, and the second preliminary cover metal oxide layer comprises copper oxide or molybdenum-tantalum oxide.

12. The method of claim 1, wherein each of the first preliminary metal layer and the second preliminary metal layer comprises copper, titanium, or molybdenum.

13. The method of claim 1, wherein the first preliminary low-reflection layer is formed by a sputtering apparatus comprising a cylindrical target and a magnet disposed in the cylindrical target.

14. The method of claim 13, wherein the cylindrical target extends along an extending direction of the opening.

15. The method of claim 14, wherein the magnet disposed in the cylindrical target is positioned in a direction between a direction perpendicular to an upper surface of the barrier layer from a rotational axis positioned in the cylindrical target and a direction from an upper edge of the second side surface defining the opening toward a lower edge of the first side surface defining the opening.

16. The method of claim 1, wherein the second preliminary low-reflection layer is formed by a sputtering apparatus comprising a cylindrical target and a magnet disposed in the cylindrical target.

17. The method of claim 16, wherein the cylindrical target extends along an extending direction of the opening.

18. The method of claim 17, wherein the magnet disposed in the cylindrical target is positioned in a direction between a direction perpendicular to an upper surface of the barrier layer from a rotational axis positioned in the cylindrical target and a direction from an upper edge of the first side surface defining the opening toward a lower edge of the second side surface defining the opening.

19. A method of manufacturing a display device, the method comprising:

forming a barrier layer on a light emitting element;

forming a first organic layer defining an opening exposing a portion of the barrier layer and overlapping the light emitting element in a plan view on the barrier layer;

forming a first preliminary low-reflection layer covering a first side surface of the first organic layer defining the opening and an upper surface of the first organic layer, the first preliminary low-reflection layer exposes the second side surface defining the opening;

forming a second preliminary low-reflection layer covering a second side surface of the first organic layer defining the opening and opposite to the first side surface and the upper surface of the first organic layer, the second preliminary low-reflection layer exposes the first preliminary low-reflection layer covering the first side surface defining the opening;

forming a low-reflection barrier covering the first side surface and the second side surface defining the opening by anisotropic dry etching of the first preliminary low-reflection layer and the second preliminary low-reflection layer; and forming a second organic layer filling the opening of the first organic layer.

* * * * *